US012699831B2

(12) United States Patent
Verma et al.

(10) Patent No.: US 12,699,831 B2
(45) Date of Patent: Aug. 4, 2026

(54) METHOD OF IMPLEMENTING AN INTEGRATED CIRCUIT HAVING A NARROW-WIDTH CELL AND A WIDER-WIDTH CELL WITH SAME FUNCTIONALITY

(71) Applicant: TAIWAN SEMICONDUCTOR MANUFACTURING COMPANY, LTD., Hsinchu (TW)

(72) Inventors: Anurag Verma, Hsinchu (TW); Meng-Kai Hsu, Hsinchu (TW); Chiwei Hu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 896 days.

(21) Appl. No.: 17/841,661

(22) Filed: Jun. 15, 2022

(65) Prior Publication Data

US 2023/0237235 A1     Jul. 27, 2023

Related U.S. Application Data

(60) Provisional application No. 63/310,645, filed on Feb. 16, 2022, provisional application No. 63/303,847, filed on Jan. 27, 2022.

(51) Int. Cl.
| | |
|---|---|
| *G06F 30/392* | (2020.01) |
| *G06F 30/3953* | (2020.01) |
| *H10D 89/10* | (2025.01) |

(52) U.S. Cl.
CPC ........ *G06F 30/392* (2020.01); *G06F 30/3953* (2020.01); *H10D 89/10* (2025.01)

(58) Field of Classification Search
CPC ...................................................... G06F 30/392
USPC ........................................................ 716/119
See application file for complete search history.

(56) References Cited

U.S. PATENT DOCUMENTS

| | | |
|---|---|---|
| 2016/0064067 A1 | 3/2016 | Mojumder et al. |
| 2018/0365368 A1* | 12/2018 | Do ........................ G06F 30/398 |
| 2020/0074041 A1* | 3/2020 | Chen ..................... G06F 30/392 |
| 2021/0343698 A1 | 11/2021 | Peng et al. |
| 2021/0408011 A1 | 12/2021 | Fujiwara et al. |

FOREIGN PATENT DOCUMENTS

| | | |
|---|---|---|
| CN | 109087914 | 12/2018 |
| KR | 10-2020-0018134 | 2/2020 |
| KR | 10-2022-0001460 | 1/2022 |
| TW | 202134928 | 9/2021 |
| TW | 202141639 | 11/2021 |
| TW | 202201640 | 1/2022 |

* cited by examiner

*Primary Examiner* — Eric D Lee
(74) *Attorney, Agent, or Firm* — Hauptman Ham, LLP

(57) ABSTRACT

An integrated circuit includes a first circuit cell having a first width and a second circuit cell having a second width that is wider than the first width by at least one contacted poly pitch. An equivalent circuit of the first circuit cell is the same as an equivalent circuit of the second circuit cell.

20 Claims, 16 Drawing Sheets

1000

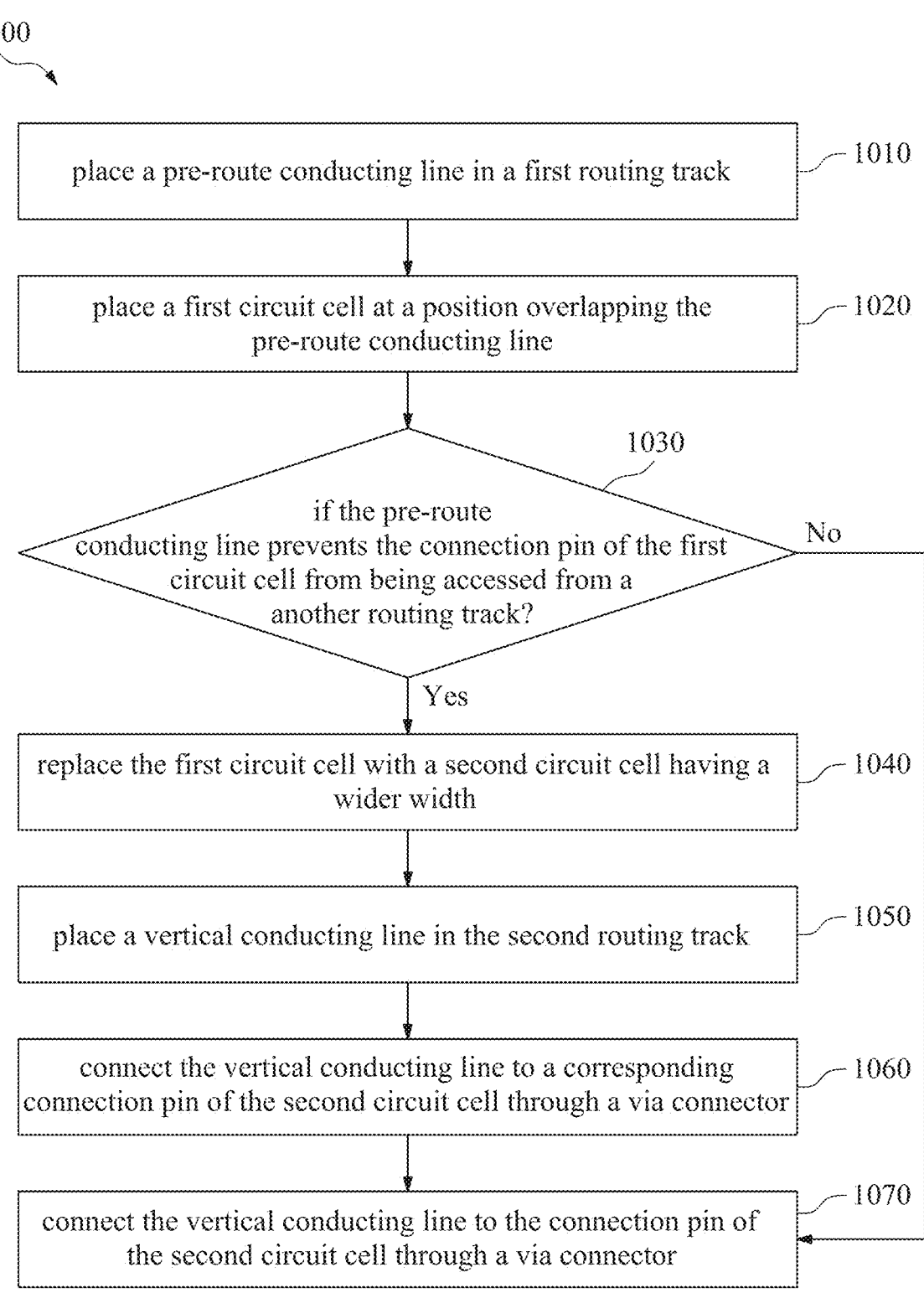

place a pre-route conducting line in a first routing track — 1010 place a first circuit cell at a position overlapping the pre-route conducting line — 1020 if the pre-route conducting line prevents the connection pin of the first circuit cell from being accessed from a another routing track? — 1030

No

Yes replace the first circuit cell with a second circuit cell having a wider width — 1040 place a vertical conducting line in the second routing track — 1050 connect the vertical conducting line to a corresponding connection pin of the second circuit cell through a via connector — 1060 connect the vertical conducting line to the connection pin of the second circuit cell through a via connector — 1070

Fig. 10

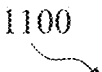

1100

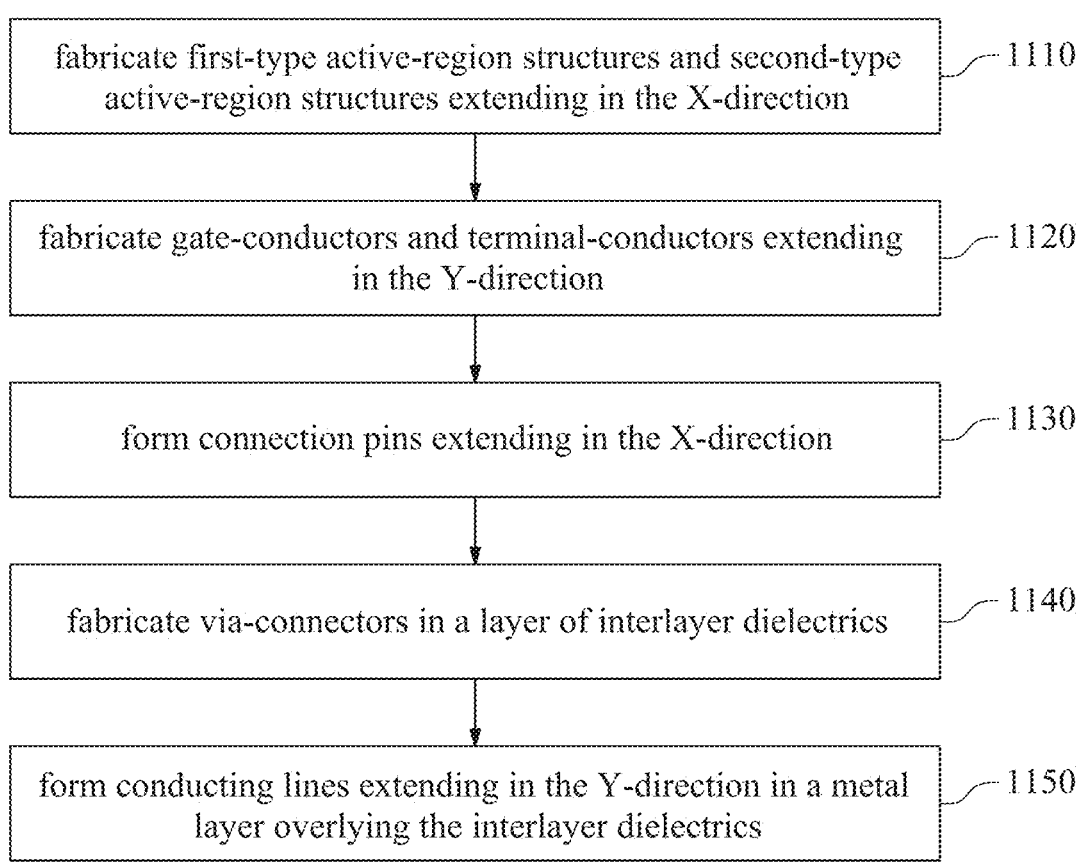

| | |
|---|---|
| fabricate first-type active-region structures and second-type active-region structures extending in the X-direction | 1110 |
| fabricate gate-conductors and terminal-conductors extending in the Y-direction | 1120 |
| form connection pins extending in the X-direction | 1130 |
| fabricate via-connectors in a layer of interlayer dielectrics | 1140 |
| form conducting lines extending in the Y-direction in a metal layer overlying the interlayer dielectrics | 1150 |

Fig. 11

METHOD OF IMPLEMENTING AN INTEGRATED CIRCUIT HAVING A NARROW-WIDTH CELL AND A WIDER-WIDTH CELL WITH SAME FUNCTIONALITY

PRIORITY CLAIM AND CROSS-REFERENCE

The present application claims the priority of U.S. Provisional Application No. 63/310,645, filed Feb. 16, 2022, and U.S. Provisional Application No. 63/303,847, filed Jan. 27, 2022, each of which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flow chart of a method of generating a layout diagram, in accordance with some embodiments.

FIG. 11 is a flow chart of a method 1100 of manufacturing an integrated circuit, in accordance with some embodiments.

DETAILED DESCRIPTION

Figures 1A, 1B:
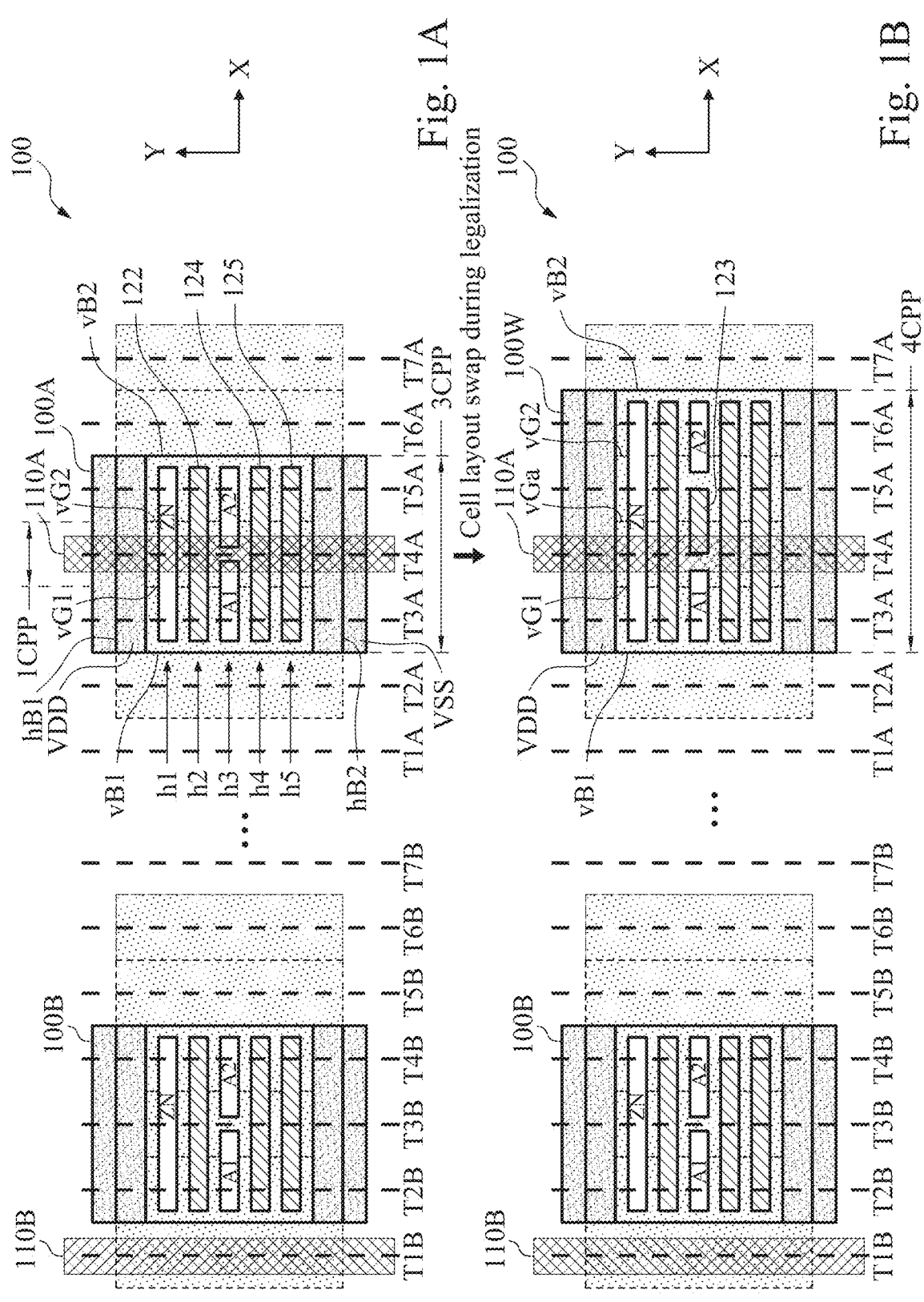
FIGS. 1A-1C are layout diagrams of an integrated circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1C:
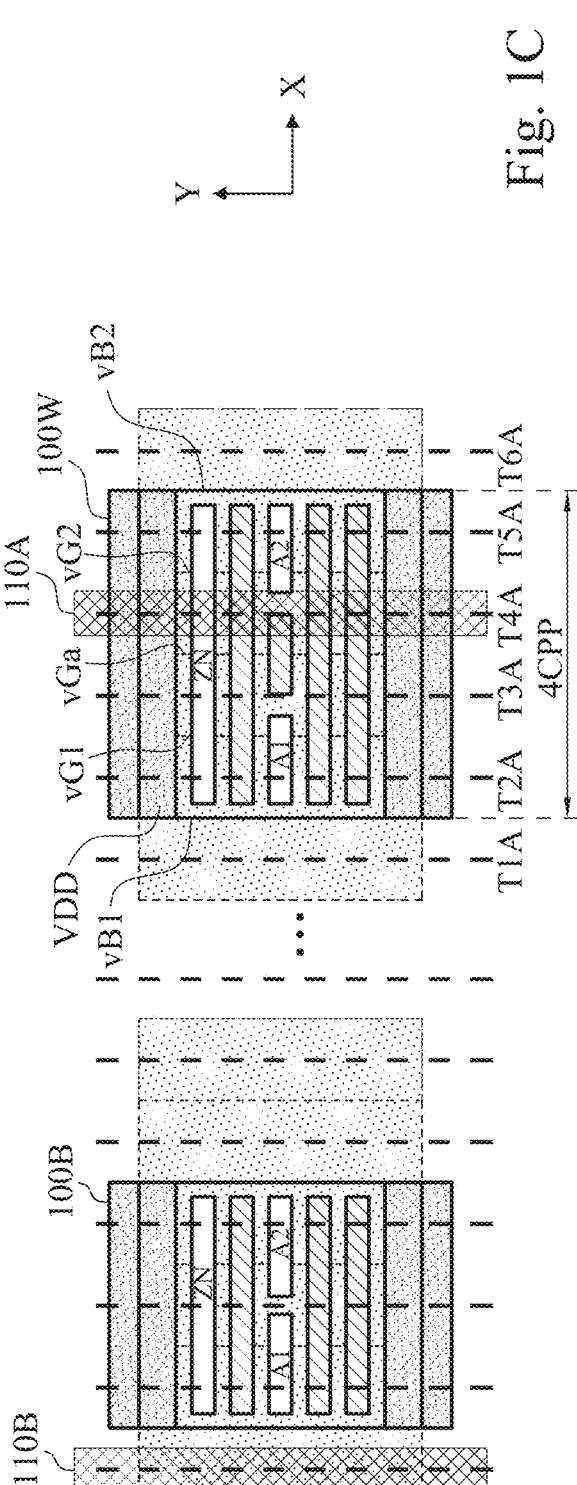

FIGS. 1A-1C are layout diagrams of an integrated circuit 100, in accordance with some embodiments. The layout diagram in FIG. 1A includes circuit cells 100A and 100B, while each of the diagrams in FIGS. 1B-1C includes circuit cells 100W and 100B. A design rule violation associated with the circuit cell 100A in FIG. 1A is remedied when the circuit cell 100A in FIG. 1A is substituted with the wider circuit cell 100W in FIG. 1B or FIG. 1C. The wider circuit cell 100W has a function which is identical to the function of the circuit cell 100A, while the wider circuit cell 100W has a width that is larger than the width of the circuit cell 100A by at least one Contacted Poly Pitch (CPP).

In FIG. 1A, the circuit cells 100A and 100B are positioned in a same row extending in the X-direction. Other circuit cells between circuit cells 100A and 100B, which are not explicitly shown, are represented graphically with the symbol " . . . " between the circuit cells 100A and 100B. In the layout diagram of FIG. 1B or FIG. 1C, the circuit cells 100W and 100B are also positioned in a same row extending in the X-direction, as the wider circuit cell 100W replaces the circuit cell 100A in FIG. 1A. The layout diagrams in FIGS. 1A-1C are provided as examples. In other implementations, the circuit cells 100A and 100B are not positioned in the same row, and correspondingly the circuit cells 100W and 100B are not positioned in the same row.

In FIG. 1A, each of the circuit cells 100A and 100B is bounded in the Y-direction between two horizontal boundaries (hB1 and hB2) and bounded in the X-direction between two vertical boundaries (vB1 and vB2). Each of the circuit cells 100A and 100B receives the supply voltages from the power rails VDD and VSS. Each of the circuit cells 100A and 100B includes multiple horizontal conducting lines extending in the X-direction and multiple connection pins extending in the X-direction. The connection pin ZN in the circuit cell 100A is positioned in horizontal routing track h1, and the connection pins A1 and A2 in the circuit cell 100A are positioned in horizontal routing track h3. The horizontal conducting lines 122, 124, and 125 in the circuit cell 100A are correspondingly positioned in horizontal routing track h2, h4, and h5. In some example embodiments, each of the circuit cells 100A and 100B is implemented as a logic gate that has two inputs and one output, in which the connection pins A1 and A2 provide correspondingly the two inputs of the logic gate while the connection pin ZN provides correspondingly the one output of the logic gate.

In FIG. 1A, the vertical conducting lines are positioned in alignment with vertical routing tracks. The vertical routing tracks that overlap with the circuit cell 100A or in the vicinity of the circuit cell 100A include vertical routing tracks TIA, T2A, T3A, T4A, T5A, T6A, and T7A. The vertical routing tracks that overlap with the circuit cell 100B or in the vicinity of the circuit cell 100B include vertical routing tracks T1B, T2B, T3B, T4B, T5B, T6B, and T7B. The vertical conducting lines in the vertical routing tracks T1A-T7A and T1B-T7B are in a metal layer that is different from the metal layer containing the horizontal conducting lines (e.g., 122, 124, and 125) and connection pins (e.g., ZN, A1, and A2) extending in the X-direction. For example, in some embodiments, the horizontal conducting lines (e.g., 122, 124, and 125) and connection pins (e.g., ZN, A1, and A2) are in a first metal layer M0 above the top insulation layer fabricated in the front-end-of-line (FEOL) process, while the vertical conducting lines in the vertical routing tracks (e.g., TIA-T7A and T1B-T7B) are in a second metal layer M1 above the first metal layer M0.

In FIG. 1A, before the circuit cells 100A and 100B are positioned in the layout diagram, the vertical conducting lines 110A and 110B are correspondingly positioned in vertical routing tracks T4A and T1B as pre-route conducting lines by an Automatic Place and Route (APR) program. In one example, each of the vertical conducting lines 110A and 110B is a conducting line for a power grid. When the circuit cell 100B is positioned next to the vertical conducting line 110B, the connection pin ZN of the circuit cell 100B is accessed from the vertical conducting line in the vertical routing track T3B, while the connection pins A1 and A2 of the circuit cell 100B are correspondingly accessed from the vertical conducting lines in the vertical routing tracks T2B and T4B. When the circuit cell 100A is positioned overlapping the vertical conducting line 110A, the connection pins A1 and A2 of the circuit cell 100A are correspondingly accessed from the vertical conducting lines in the vertical routing tracks T3A and T5A. The connection pin ZN of the circuit cell 100A, however, cannot be accessed from any of the vertical conducting line in the vertical routing tracks as shown in FIG. 1A. Consequently, positioning the circuit cell 100A at a location having an overlap with a pre-route conducting line (e.g., the vertical conducting line 110A) as shown in FIG. 1A results in a design rule violation related to connection pins.

The design rule violation is remedied when the circuit cell 100A in FIG. 1A is substituted with the wider circuit cell 100W in FIG. 1B or FIG. 1C. The wider circuit cell 100W has a same function as the circuit cell 100A but has a width that is wider than the circuit cell 100A along with the X-direction. In FIG. 1B, the connection pins A1 and A2 of the wider circuit cell 100W are correspondingly accessed from the vertical conducting lines in the vertical routing tracks T3A and T6A, while the connection pin ZN of the wider circuit cell 100W is accessed from the vertical conducting line in the vertical routing track T5A. In FIG. 1C, the connection pins A1 and A2 of the wider circuit cell 100W are correspondingly accessed from the vertical conducting lines in the vertical routing tracks T2A and T5A, while the connection pin ZN of the wider circuit cell 100W is accessed from the vertical conducting line in the vertical routing track T3A.

During the process of remedying the design rule violations, when the circuit cell 100A in FIG. 1A is substituted with the wider circuit cell 100W in FIG. 1B or FIG. 1C, the cascaded displacement of adjacent cells in the vicinity of the circuit cell 100A due to the cell substitution is reduced, as compared with an alternative implementation in which the circuit cell 100A is moved to another position to remedy the design rule violations. For example, in an alternative implementation of moving the circuit cell 100A to avoid overlapping with the vertical conducting lines 110A, the circuit cell 100A is moved at minimum by a distance of 2 CPP either towards the positive X-direction or towards the negative X-direction. In contrast, when the circuit cell 100A in FIG. 1A is substituted with the wider circuit cell 100W in FIG. 1B, as the width of the wider circuit cell 100W is increased, only the boundary vB2 of the circuit cell is shifted towards the positive X-direction by a distance of one CPP. Similarly, when the circuit cell 100A in FIG. 1A is substituted with the wider circuit cell 100W in FIG. 1C, as the width of the wider circuit cell 100W is increased, only the boundary vB1 of the circuit cell is shifted towards the negative X-direction by a distance of one CPP.

In the layout diagram of FIG. 1B or FIG. 1C, the cascaded displacement of adjacent cells due to the cell substitution is reduced to one CPP. In the examples as shown in FIGS. 1A-1C, the alternative implementation of moving the circuit cell 100A to another location would result in the cascaded displacement of adjacent cells to be shifted by two CPPs. In other examples, when the circuit cell of interest encounters the design rule violation related to pin access becomes larger and wider, moving the circuit cell of interest to another location would result in the cascaded displacement of adjacent cells to be larger than two CPPs, while substituting the circuit cell of interest with a circuit cell of same function and with a wider width may still only results in one CPP shift for the cascaded displacement of adjacent cells. The reduction of the cascaded displacement of adjacent cells often corresponds to shorter routing wires, which may lead to lower congestion, reduced time delay, and lower power consumption. Additionally, substituting the circuit cell of interest with a circuit cell of same function and with a wider width may also result in better utilization of the layout areas in the vicinity of the pre-route conducting line (e.g., the vertical conducting lines 110A) that causes the design rule violations, and consequently may lead to more floorplan space available for other circuit cells.

In FIG. 1A, the circuit cell 100A and the circuit cell 100B have the same cell layout design. In FIGS. 1B-1C, the wider circuit cell 100W and the circuit cell 100B have different cell layout designs but have the same circuit specification. In some embodiments, the circuit cell 100A and the circuit cell 100B has the same circuit function and has the same SPICE specification in a circuit description file. In FIG. 1B or FIG. 1C, the circuit cell 100A in FIG. 1A is substituted with the wider circuit cell 100W, and the circuit function of the circuit cell 100W is the same as the circuit function of the circuit cell 100B. The cell layout of the wider circuit cell 100W, however, is not the same as the cell layout of the circuit cell 100B or the cell layout of the circuit cell 100A. For example, the cell width of the circuit cell 100A (or the circuit cell 100B) in FIG. 1A is 3 CPP, whereas the cell width of the wider circuit cell 100W in FIG. 1B or in FIG. 1C is 4 CPP.

In some embodiments, the circuit cell 100W and the circuit cell 100B has a same equivalent circuit at the register-transfer level (RTL). In some embodiments, the circuit cell 100W and the circuit cell 100B have a same equivalent circuit as specified by a hardware description language, such as, VHDL or Verilog. In some embodiments, the circuit cell 100W and the circuit cell 100B are different layout designs of a same logic gate. In some embodiments, the circuit cell 100W and the circuit cell 100B are different layout designs of a same analog circuit as described by a same schematic file or a same pre-layout SPICE netlist file, even though the post-layout SPICE simulation netlists extracted from the layout designs of the circuit cell 100W and the circuit cell 100B are different. The different post-layout SPICE simulation netlists account for minor timing variations between the timing diagrams of the circuit cell 100W and the circuit cell 100B.

In FIG. 1A, gate alignment lines vG1 and vG2 identify the positions of the gate-conductors (not shown in figure) extending in the Y-direction for the PMOS transistors and the NMOS transistors in the circuit cell 100A. The distance between the gate alignment lines vG1 and vG2 is one Contacted Poly Pitch (CPP), which is the pitch distance between two gate-conductors positioned correspondingly at the gate alignment lines vG1 and vG2. The distance between the boundary vB1 and the gate alignment line vG1 is one CPP, and the distance between the boundary vB2 and the gate alignment line vG2 is also one CPP. Therefore, the cell width of the circuit cell 100A is 3 CPP.

In some embodiments, each of the vertical boundary vB1 and the vertical boundary vB2 of the circuit cell 100A in a fabricated integrated circuit is identified by the corresponding dummy gate-conductors positioned at the vertical boundary vB1 and the vertical boundary vB2. In some embodiments, each of the vertical boundary vB1 and the vertical boundary vB2 of the circuit cell 100A in a fabricated integrated circuit is identified by the corresponding isolation regions that isolate the source/drain regions in the circuit cell 100A from the source/drain regions in the neighboring circuit cells. In some embodiments, each of the horizontal boundary hB1 and the horizontal boundary hB2 of the circuit cell 100A in a fabricated integrated circuit is identified based on the location and the geometry of the power rails VDD and VSS. For example, in some embodiments, the horizontal boundary hB1 is aligned with a middle line (extending in the X-direction) in the power rail VDD, and the horizontal boundary hB2 is aligned with a middle line (extending in the X-direction) in the power rail VSS.

In some embodiments, the wider circuit cell 100W in FIG. 1B or FIG. 1C is modified based on the circuit cell 100A in FIG. 1A. In some embodiments, the wider circuit cell 100W includes a new gate alignment line vGa inserted between the gate alignment lines vG1 and vG2, and the distance between the gate alignment lines vG1 and vG2 becomes 2 CPP. The gate-conductors aligned with the gate alignment lines vG1 in the circuit cell 100A are maintained as corresponding gate-conductors aligned with the gate alignment line vG1 in the wider circuit cell 100W. The gate-conductors aligned with the gate alignment line vG2 in the circuit cell 100A are maintained as corresponding gate-conductors aligned with the gate alignment line vG2 in the wider circuit cell 100W. In some embodiments, dummy gate-conductors aligned with the new gate alignment line vGa are added in the wider circuit cell 100W. In some embodiments, no dummy gate-conductor aligned with the new gate alignment line vGa is added in the wider circuit cell 100W, and no real gate-conductor aligned with the new gate alignment line vGa is added in the wider circuit cell 100W.

In some embodiments, no PMOS transistors and no NMOS transistors are added to the wider circuit cell 100W when the circuit cell 100A is modified to become the wider circuit cell 100W, and an equivalent circuit of the wider circuit cell 100W is the same as an equivalent circuit of the circuit cell 100A. In some embodiments, while an equivalent circuit of the wider circuit cell 100W represented in logic gates is still the same as an equivalent circuit of the circuit cell 100A represented in logic gates, and an PMOS transistor and an NMOS transistor are added to the wider circuit cell 100W when the circuit cell 100A is modified to become the wider circuit cell 100W, in which the driving strength of one or more logic gates in the wider circuit cell 100W is enhanced by the newly added PMOS transistors and/or NMOS transistors. In some embodiment, the newly added PMOS transistor and the newly added NMOS transistor are positioned between the gate alignment lines vG1 and vG2, and the gate-conductors for the newly added PMOS transistor and the newly added NMOS transistor are aligned with the new gate alignment line vGa.

Figure 1D:
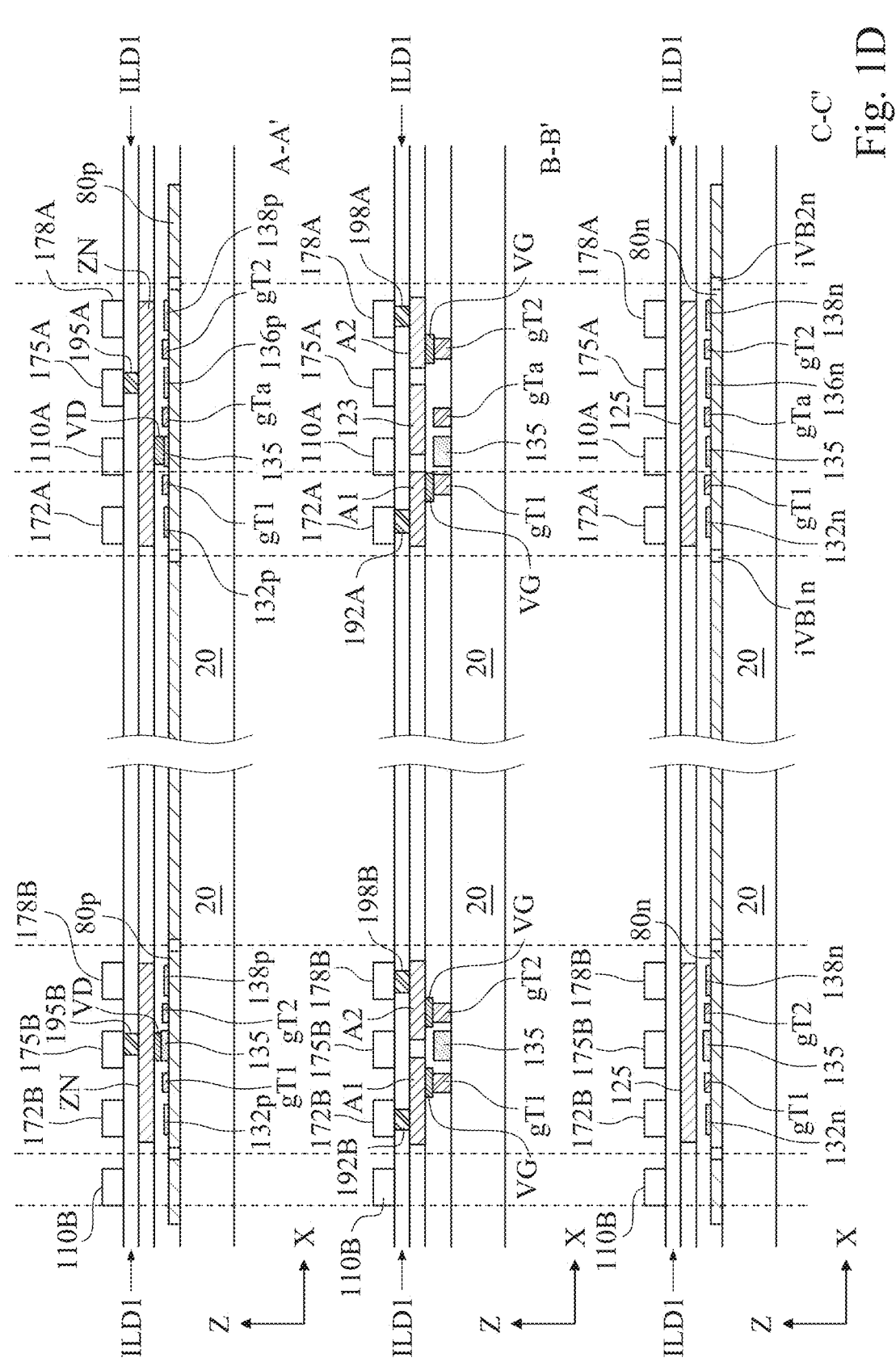
FIG. 1D is cross-sectional views of the integrated circuit 100 in cutting planes A-A', B-B', and C-C' as specified by FIG. 1B, in accordance with some embodiments.

FIG. 1D is cross-sectional views of the integrated circuit 100 in cutting planes A-A', B-B', and C-C' as specified by FIG. 1B, in accordance with some embodiments. In the cross-sectional view of the cutting plane A-A' as shown in FIG. 1D, the active-region structure 80p is on a substrate 20. The active regions (such as, the source region, the channel region, or the drain region) in the active-region structure 80p in the circuit cell 100B are isolated from the active regions in the adjacent cells by the boundary isolation regions ivB1*p* and ivB2*p* correspondingly at the vertical boundaries vB1 and vB2 of the circuit cell 100B. The active regions (such as the source region, the channel region, or the drain region) in the active-region structure 80p in the wider circuit cell 100W are isolated from the active regions in the adjacent cells by the boundary isolation regions ivB1*p* and ivB2*p* correspondingly at the vertical boundaries vB1 and vB2 of the wider circuit cell 100W.

In FIG. 1D, each of the gate-conductors gT1 and gT2 in the circuit cell 100B or in the wider circuit cell 100W intersects the active-region structure 80p at the channel region of a corresponding PMOS transistor. Each of the terminal-conductors 132p, 135, and 138p in the circuit cell 100B or in the wider circuit cell 100W intersects the active-region structure 80p at the corresponding source/drain region of at least one PMOS transistor. In the wider circuit cell 100W, while the dummy gate-conductor gTa intersects the active-region structure 80p, the dummy gate-conductor gTa nevertheless is not implemented as a gate terminal of a functioning transistor in the wider circuit cell 100W. The connection pin ZN in the circuit cell 100B or in the wider circuit cell 100W is in a metal layer overlying the interlayer dielectric that covers the gate-conductors (e.g., gT1 and gT2) and the terminal-conductors (e.g., 132p, 135, and 138p). The connection pin ZN is conductively connected to the terminal-conductor 135 through a via-connector VD.

In the cross-sectional view of the cutting plane B-B' as shown in FIG. 1D, the gate-conductors (gT1 and gT2) and the terminal-conductor 135 in the circuit cell 100B and in the wider circuit cell 100W are all on the substrate 20. The dummy gate-conductors gTa in the wider circuit cell 100W is also on the substrate 20.

The connection pins A1 and A2 in the circuit cell 100B and in the wider circuit cell 100W are all in the metal layer overlying the interlayer dielectric that covers the gate-conductors (e.g., gT1 and gT2) and the terminal-conductor 135. The horizontal conducting line 125 in the wider circuit cell 100W is also in the metal layer overlying the interlayer dielectric that covers the gate-conductors (e.g., gT1 and gT2) and the terminal-conductor 135. The connection pin A1 is conductively connected to the gate-conductor gT1 through a corresponding via-connector VG. The connection pin A2 is conductively connected to the gate-conductor gT2 through a corresponding via-connector VG.

In the cross-sectional view of the cutting plane C-C' as shown in FIG. 1D, the active-region structure 80n is on the substrate 20. The active regions (such as, the source region, the channel region, or the drain region) in the active-region structure 80n in the circuit cell 100B are isolated from the active regions in the adjacent cells by the boundary isolation regions ivB1n and ivB2n correspondingly at the vertical boundaries vB1 and vB2 of the circuit cell 100B. The active regions (such as, the source region, the channel region, or the drain region) in the active-region structure 80n in the wider circuit cell 100W are isolated from the active regions in the adjacent cells by the boundary isolation regions ivB1n and ivB2n correspondingly at the vertical boundaries vB1 and vB2 of the wider circuit cell 100W.

In FIG. 1D, each of the gate-conductors gT1 and gT2 in the circuit cell 100B or in the wider circuit cell 100W intersects the active-region structure 80n at the channel region of a corresponding NMOS transistor. Each of the terminal-conductors 132p, 135, and 138p in the circuit cell 100B or in the wider circuit cell 100W intersects the active-region structure 80n at the corresponding source/drain region of at least one NMOS transistor. In the wider circuit cell 100W, while the dummy gate-conductor gTa intersects the active-region structure 80n, the dummy gate-conductor gTa nevertheless is not implemented as a gate terminal of a functioning transistor in the wider circuit cell 100W. The horizontal conducting line 125 in the circuit cell 100B or in the wider circuit cell 100W is in a metal layer overlying the interlayer dielectric that covers the gate-conductors (e.g., gT1 and gT2) and the terminal-conductors (e.g., 132n, 135, and 138n).

In FIG. 1D, the connection pin ZN, the connections pins A1 and A2, and the horizontal conducting line 125 are all covered by a layer of interlayer dielectric IDL1. The vertical conducting lines 110A and 110B are in a metal layer overlying the layer of interlayer dielectric IDL1. In some embodiments, each of the vertical conducting lines 110A and 110B is a power grid conducting line. The vertical conducting lines 110A and 110B are correspondingly aligned with the vertical routing tracks T1B and T4A (as shown in FIG. 1B). The vertical conducting lines 172A, 175A, 178A intersecting the wider circuit cell 100W and the vertical conducting lines 172B, 175B, and 178B intersecting the circuit cell 100B are also in the metal layer overlying the layer of interlayer dielectric IDL1. The vertical conducting lines 172A, 175A, 178A are correspondingly aligned with the vertical routing tracks T3A, T5A, and T6A (as shown in FIG. 1B), while the vertical conducting lines 172A, 175A, 178A are correspondingly aligned with the vertical routing tracks T2B, T3B, and T4B (as shown in FIG. 1B).

In the cross-sectional view of the cutting plane A-A' as shown in FIG. 1D, the vertical conducting line 175A is conductively connected to the connection pin ZN of the wider circuit cell 100W through a via-connector 195A, while the vertical conducting line 175B is conductively connected to the connection pin ZN of the circuit cell 100B through a via-connector 195B. In the cross-sectional view of the cutting plane B-B' as shown in FIG. 1D, the vertical conducting line 172A is conductively connected to the connection pin A1 of the wider circuit cell 100W through a via-connector 192A, and the vertical conducting line 178A is conductively connected to the connection pin A2 of the wider circuit cell 100W through a via-connector 198A. The vertical conducting line 172B is conductively connected to the connection pins A1 of the circuit cell 100B through a via-connector 192B, and the vertical conducting line 178B is conductively connected to the connection pin A2 of the circuit cell 100B through a via-connector 198B.

In addition to the wider circuit cell 100W in FIG. 1B or FIG. 1C, other implementations of the wider circuit cell are shown in FIGS. 2-6. When the circuit cell 100A in FIG. 1A is substituted with any one of the wider circuit cells in FIGS. 2-6, the previously identified design rule violation related to pin access is remedied.

Figure 2:
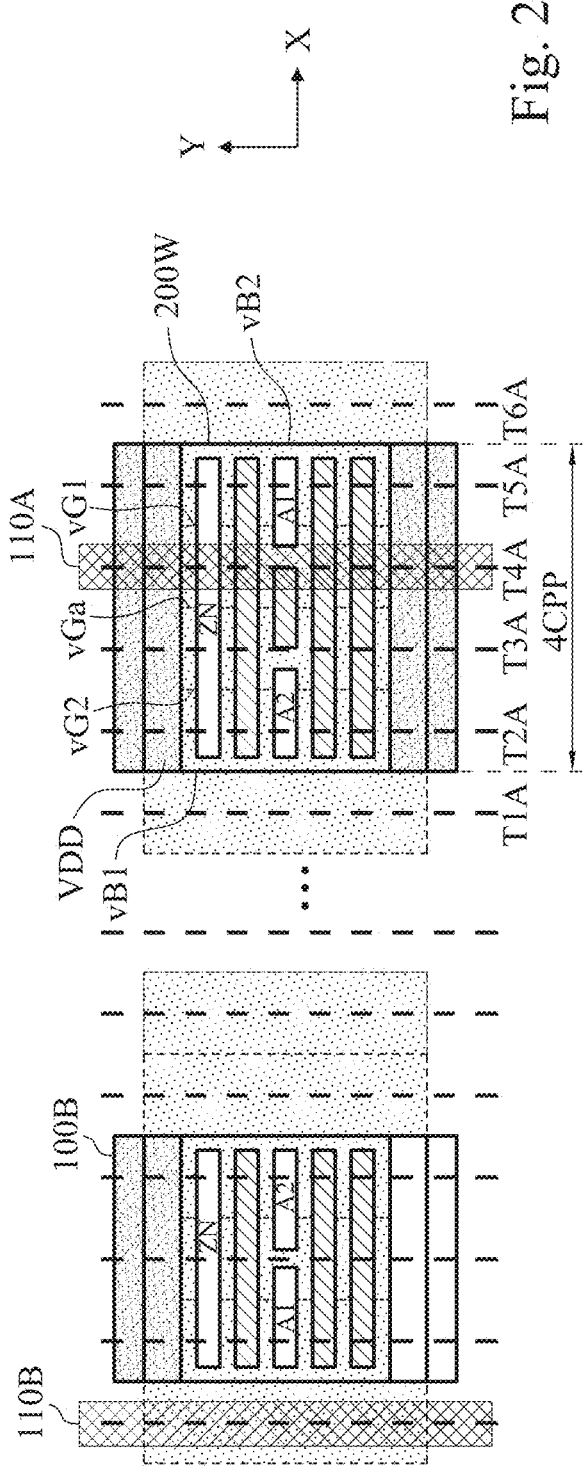
FIGS. 2-6 are layout diagrams of an integrated circuit having a wider circuit cell, in accordance with some embodiments.

FIG. 2 is a layout diagram of an integrated circuit having a wider circuit cell, in accordance with some embodiments. The layout design of the wider circuit cell 200W in FIG. 2 is a reflection of the wider circuit cell 100W in FIG. 1B (relative to a reflection axis extending in the Y-direction), which results in the exchange of the positions of the connection pins A1 and A2 along the X-direction. In both the wider circuit cell 100W of FIG. 1B and the wider circuit cell 200W of FIG. 2, the new gate alignment line vGa is inserted between the gate alignment lines vG1 and vG2.

In the wider circuit cell 100W of FIG. 1B, the connection pin A1 is adjacent to the boundary vB1, and the connection pin A2 is adjacent to the boundary vB2. Additionally, in the wider circuit cell 100W, the gate alignment line vG1 is adjacent to the boundary vB1, and the gate alignment line vG2 is adjacent to the boundary vB2. In contrast, in the wider circuit cell 200W of FIG. 2, the connection pin A2 is adjacent to the boundary vB1, and the connection pin A1 is adjacent to the boundary vB2. Furthermore, in the wider circuit cell 200W, the gate alignment line vG2 is adjacent to the boundary vB1, and the gate alignment line vG1 is adjacent to the boundary vB2. Because of the position exchange of the gate alignment lines vG1 and VG2, the PMOS/NMOS transistors having the gate-conductors aligned with the gate alignment line vG1 which is adjacent to the boundary vB1 in FIG. 1B are moved to new positions in FIG. 2 in which the PMOS/NMOS transistors having the gate-conductors aligned with the gate alignment line vG1 become adjacent to the boundary vB2. Similarly, the PMOS/NMOS transistors having the gate-conductors aligned with the gate alignment line vG2 which is adjacent to the boundary vB2 in FIG. 1B are moved to new positions in FIG. 2 in which the PMOS/NMOS transistors having the gate-conductors aligned with the gate alignment line vG2 become adjacent to the boundary vB1. The wider circuit cell 200W has a same function as the circuit cell 100A in FIG. 1A or the circuit cell 100B in FIG. 2.

In FIG. 2, the connection pins A1 and A2 of the wider circuit cell 200W are correspondingly accessed from the vertical conducting lines in the vertical routing tracks T5A and T2A, while the connection pin ZN of the wider circuit cell 200W is accessed from the vertical conducting line in the vertical routing track T3A.

Figure 3:
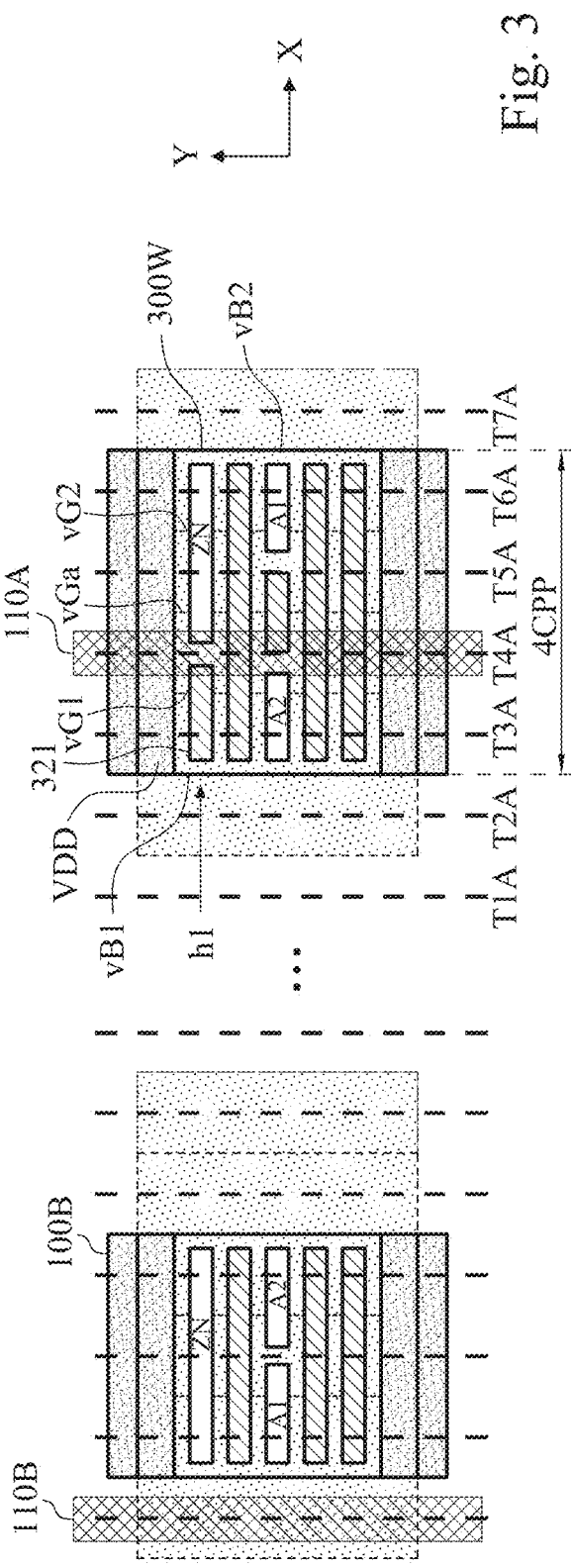
Figure 4:
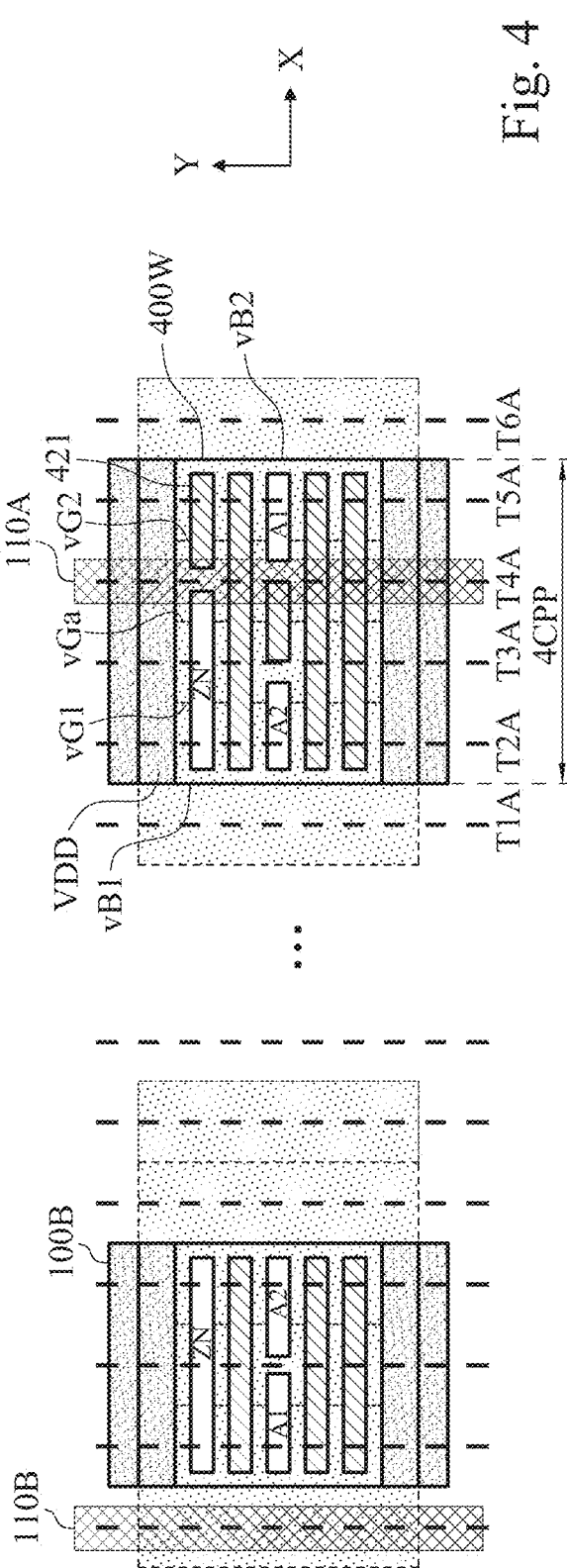

FIGS. 3-4 are layout diagrams of an integrated circuit having a wider circuit cell, in accordance with some embodiments. The wider circuit cell 300W in FIG. 3 is a modification of the wider circuit cell 100W in FIG. 1B, and the wider circuit cell 400W in FIG. 4 is a modification of the wider circuit cell 100W in FIG. 1C. The modification includes shortening the connection pin ZN of the wider circuit cell 100W. In some embodiments, shortening the connection pins in a circuit cell reduces time delays and improves the speed performance of the circuit cell.

In FIG. 3, the shortened connection pin ZN of the wider circuit cell 300W is aligned with a horizontal conducting line 321 in horizontal routing track h1, and the horizontal conducting line 321 occupies a space between the vertical boundary vB1 and the shortened connection pin ZN. The shortened connection pin ZN of the wider circuit cell 300W is accessed from the vertical conducting line in the vertical routing track T5A, while the connection pins A1 and A2 of the wider circuit cell 100W are correspondingly accessed from the vertical conducting lines in the vertical routing tracks T3A and T6A.

In FIG. 4, the shortened connection pin ZN of the wider circuit cell 400W is aligned with a horizontal conducting line 421 in horizontal routing track h1, and the horizontal conducting line 421 occupies a space between the shortened connection pin ZN and the vertical boundary vB1. In FIG. 4, the shortened connection pin ZN of the wider circuit cell 400W is accessed from the vertical conducting line in the vertical routing track T3A, while the connection pins A1 and A2 of the wider circuit cell 100W are correspondingly accessed from the vertical conducting lines in the vertical routing tracks T2A and T5A.

Figure 5:
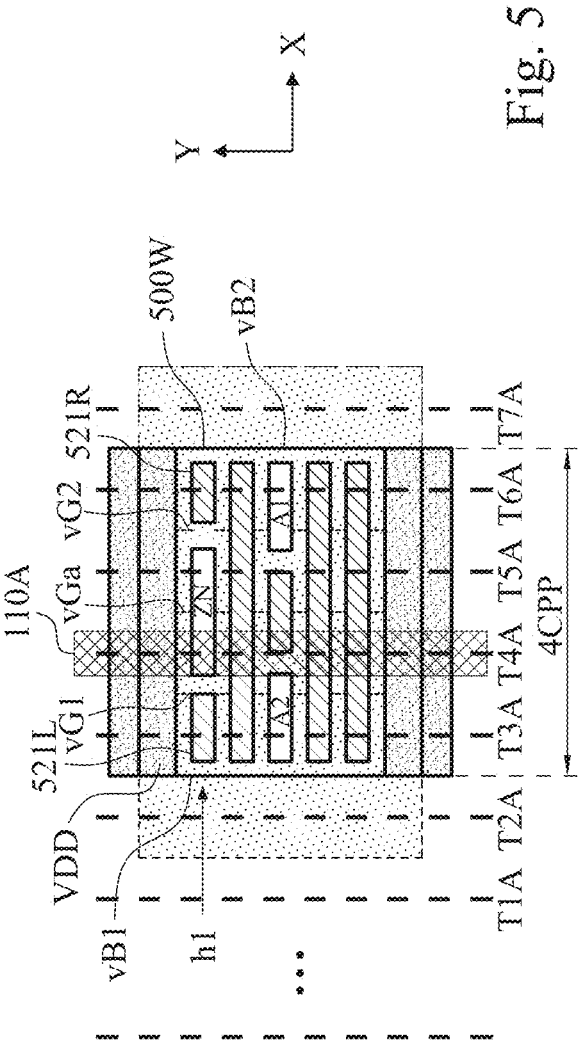
Figure 6:
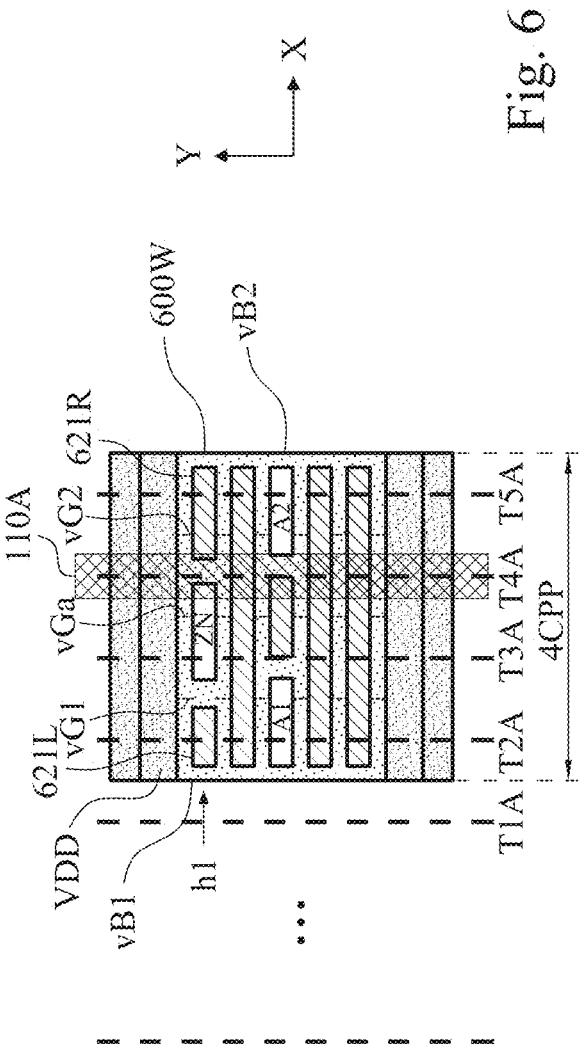

FIGS. 5-6 are layout diagrams of an integrated circuit having a wider circuit cell, in accordance with some embodiments. The wider circuit cell 500W in FIG. 5 is a modification of the wider circuit cell 100W in FIG. 1B, and the wider circuit cell 600W in FIG. 6 is a modification of the wider circuit cell 600W in FIG. 1C. The wider circuit cell 500W in FIG. 5, as a modification of the wider circuit cell 100W in FIG. 1B, includes shortening the connection pin ZN of the wider circuit cell 100W. The wider circuit cell 600W in FIG. 6, as a modification of the wider circuit cell 100W in FIG. 1C, includes shortening the connection pin ZN of the wider circuit cell 100W and elongating the connection pin A2 of the wider circuit cell 100W.

In FIG. 5, the shortened connection pin ZN of the wider circuit cell 500W is aligned with horizontal conducting lines 521L and 521R in horizontal routing track h1. The horizontal conducting line 521L occupies a space between the vertical boundary vB1 and the shortened connection pin ZN, and the horizontal conducting line 521R occupies a space between the shortened connection pin ZN and the vertical boundary vB2. The shortened connection pin ZN of the wider circuit cell 500W is accessed from the vertical conducting line in the vertical routing track T5A, while the connection pins A1 and A2 of the wider circuit cell 100W are correspondingly accessed from the vertical conducting lines in the vertical routing tracks T3A and T6A.

In FIG. 6, the shortened connection pin ZN of the wider circuit cell 600W is aligned with horizontal conducting lines 621L and 621R in horizontal routing track h1. The horizontal conducting line 621L occupies a space between the vertical boundary vB1 and the shortened connection pin ZN, and the horizontal conducting line 621R occupies a space between the shortened connection pin ZN and the vertical boundary vB2. Additionally, in FIG. 6, the elongated connection pin A2 occupies a space between the connection pin A2 and the vertical boundary vB2. The shortened connection pin ZN of the wider circuit cell 600W is accessed from the vertical conducting line in the vertical routing track T3A, while the connection pins A1 and A2 of the wider circuit cell 100W are correspondingly accessed from the vertical conducting lines in the vertical routing tracks T2A and T5A.

In the example layout diagram of FIG. 1A, the circuit cell 100A is positioned at a location which causes the circuit cell

100A overlaps with one pre-route conducting line (e.g., the vertical conducting line 110A) and results in a design rule violation related to pin access. The design rule violation is remedied as the circuit cell 100A is substituted with a wider circuit cell having the same function (e.g., the wider circuit cell 100W in FIGS. 1B-1C). Other examples of the wider circuit cell as a substitute of the circuit cell 100A includes the wider circuit cell 200W in FIG. 2, the wider circuit cell 300W in FIG. 3, the wider circuit cell 400W in FIG. 4, the wider circuit cell 500W in FIG. 5, and the wider circuit cell 600W in FIG. 6. While the circuit cell 100A overlaps with one pre-route conducting line in FIG. 1A, in some other implementations, the circuit cell 700A overlaps with two pre-route conducting lines when the circuit cell 700A is positioned in a layout diagram of FIG. 7A.

Figures 7A, 7B:
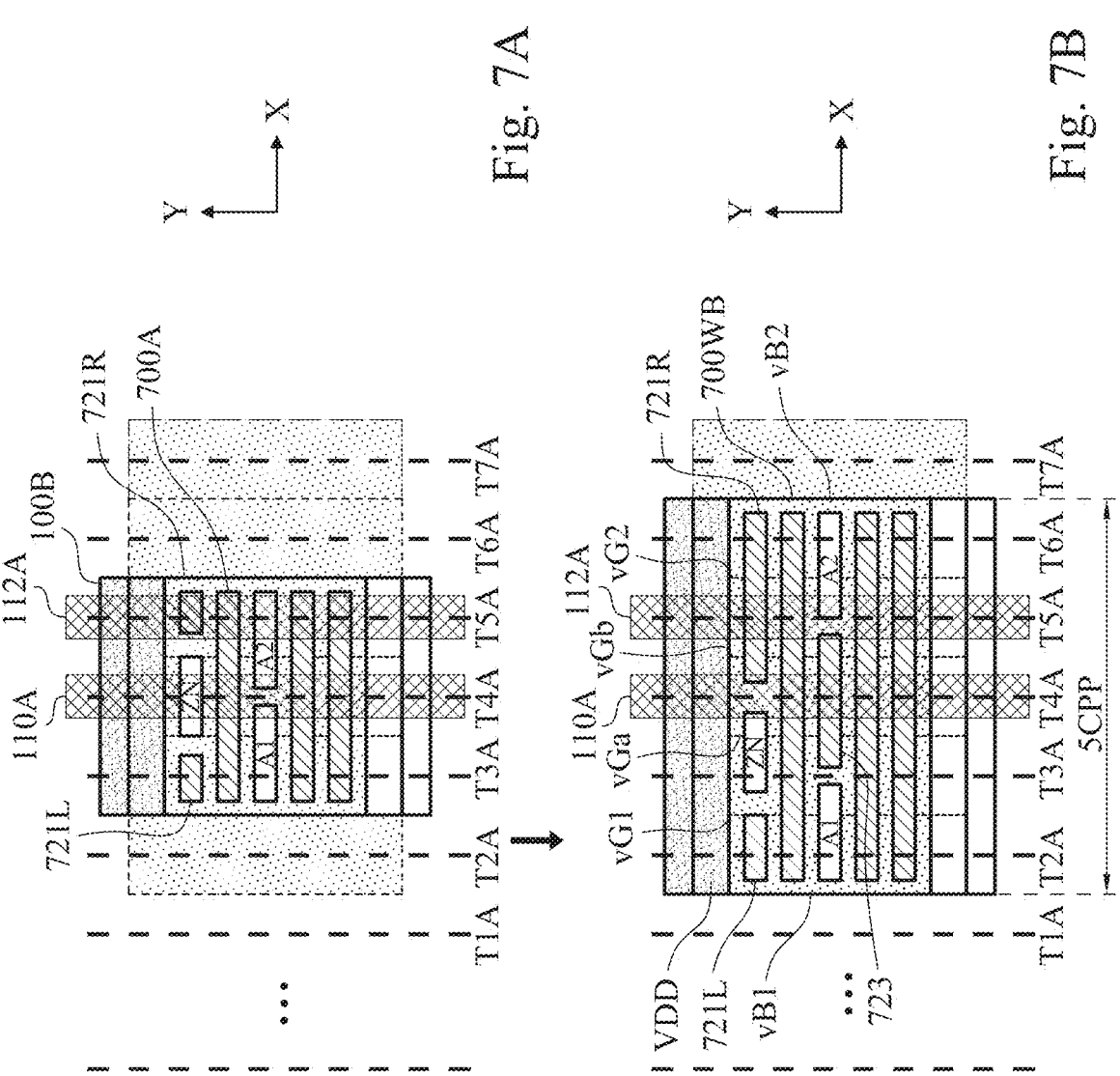
FIGS. 7A-7C are layout diagrams of an integrated circuit having a circuit cell overlapped with two pre-route conducting lines, in accordance with some embodiments.
Figure 7C:
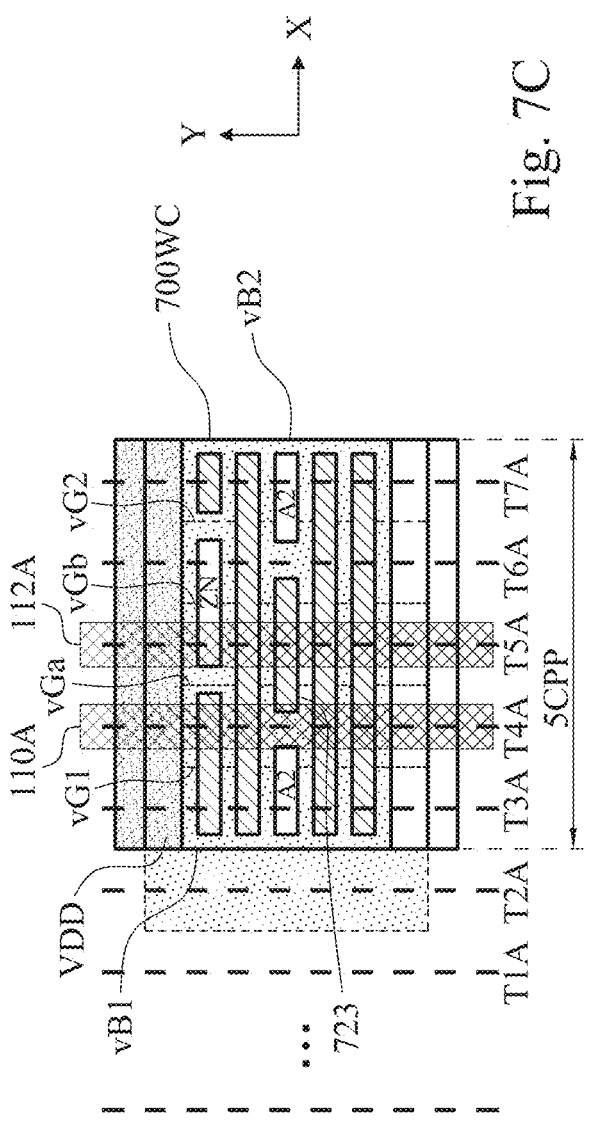

FIGS. 7A-7C are layout diagrams of an integrated having a circuit cell overlapped with two pre-route conducting lines, in accordance with some embodiments. The circuit cell 700A in FIG. 7A has a cell layout design similar to the circuit cell 100A in FIG. 1A but has a modification which includes a shortened connection pin ZN of the circuit cell 700A aligned with horizontal conducting lines 721L and 721R in horizontal routing track h1. While the circuit cell 100A in FIG. 1A overlaps with one vertical conducting line 110A, the circuit cell 700A in FIG. 7A is positioned at a location which causes the circuit cell 700A overlaps with two vertical conducting lines 110A and 112A. Each of the vertical conducting lines 110A and 112A is a pre-route conducting line that is positioned in the layout diagram before the circuit cell 700A is positioned at the location as shown. In some embodiments, each of the vertical conducting lines 110A and 112A is a power grid conducting line for providing the power supply voltage to the power rails VDD or VSS. In FIG. 7A, the vertical conducting lines 110A and 112A are correspondingly aligned with the vertical routing tracks T4A and T5A.

In FIG. 7A, because the circuit cell 700A overlaps with vertical conducting lines 110A and 112A, none of the connection pin ZN and the connection pin A2 in the circuit cell 700A is accessible from the vertical conducting lines aligned with the vertical routing tracks (e.g., T1A-T7A), which constitutes a design rule violation. In some embodiments, the design rule violation in FIG. 7A is remedied as the circuit cell 700A in FIG. 7A is substituted with the wider circuit cell 700WB in FIG. 7B or substituted with the wider circuit cell 700WC in FIG. 7C.

Each of the wider circuit cell 700WB in FIG. 7B and the wider circuit cell 700WC in FIG. 7C has the same circuit specification as the circuit cell 700A in FIG. 7A. Each of the wider circuit cell 700WB and the wider circuit cell 700WC, however, has a cell layout design that is different from the cell layout design of the circuit cell 700A. For example, the cell width of the circuit cell 700A in FIG. 7A is 3 CPP, whereas the cell width of the wider circuit cell 700WB in FIG. 7B is 5 CPP and the cell width of the wider circuit cell 700WC in FIG. 7C is also 5 CPP.

Each of the wider circuit cell 700WB in FIG. 7B and the wider circuit cell 700WC in FIG. 7C is modified based on the circuit cell 700A in FIG. 7A. In some embodiments, each of the wider circuit cells 700WB and 700WC includes two new gate alignment lines vGa and vGb inserted between the gate alignment lines vG1 and vG2, and the distance between the gate alignment lines vG1 and vG2 becomes 3 CPP. The gate-conductors aligned with the gate alignment lines vG1 in the circuit cell 700A are maintained as corresponding gate-conductors aligned with the gate alignment line vG1 in the wider circuit cells 700WB and 700WC. The gate-conductors aligned with the gate alignment line vG2 in the circuit cell 700A are maintained as corresponding gate-conductors aligned with the gate alignment line vG2 in the wider circuit cells 700WB and 700WC.

In some embodiments, dummy gate-conductors aligned with the new gate alignment lines vGa and vGb are added in the wider circuit cell (700WB or 700WC). In some embodiments, no dummy gate-conductor aligned with the new gate alignment lines vGa and vGb is added in the wider circuit cell (700WB or 700WC), and no real gate-conductor aligned with the new gate alignment lines vGa and vGb is added in the wider circuit cell (700WB or 700WC).

In some embodiments, no PMOS transistors and no NMOS transistors are added to the wider circuit cell (700WB or 700WC) when the circuit cell 700A is modified to become the wider circuit cell, and an equivalent circuit of the wider circuit cell (700WB or 700WC) is the same as an equivalent circuit of the circuit cell 700A. In some embodiments, while an equivalent circuit of the wider circuit cell (700WB or 700WC) represented in logic gates is still the same as an equivalent circuit of the circuit cell 700A represented in logic gates, and at least one PMOS transistor and at least one NMOS transistor are added to the wider circuit cell (700WB or 700WC) when the circuit cell 700A is modified to become the wider circuit cell (700WB or 700WC), in which the driving strength of one or more logic gates in the wider circuit cell (700WB or 700WC) is enhanced by the newly added PMOS transistors and/or NMOS transistors. The gate-conductor for each of the newly added PMOS transistors and the newly added NMOS transistors is aligned with one of the new gate alignment lines vGa and vGb.

In FIGS. 7B-7C, a horizontal conducting line 723 is added between the connection pins A1 and A2, which reduces at least one of the lengths of the connection pins A1 and A2. Additionally, the lengths of the horizontal conducting lines 721L and 721R in horizontal routing track h1 are modified, as compared with the corresponding lengths of the horizontal conducting lines in the circuit cell 700A of FIG. 7A. In FIG. 7B, the connection pin ZN of the wider circuit cell 700WB is accessed from the vertical conducting line in the vertical routing track T3A, while the connection pins A1 and A2 of the wider circuit cell 700WB are correspondingly accessed from the vertical conducting lines in the vertical routing tracks T2A and T6A. In FIG. 7C, the connection pin ZN of the wider circuit cell 700WC is accessed from the vertical conducting line in the vertical routing track T6A, while the connection pins A1 and A2 of the wider circuit cell 700WB are correspondingly accessed from the vertical conducting lines in the vertical routing tracks T3A and T7A.

Figures 8A, 8B:
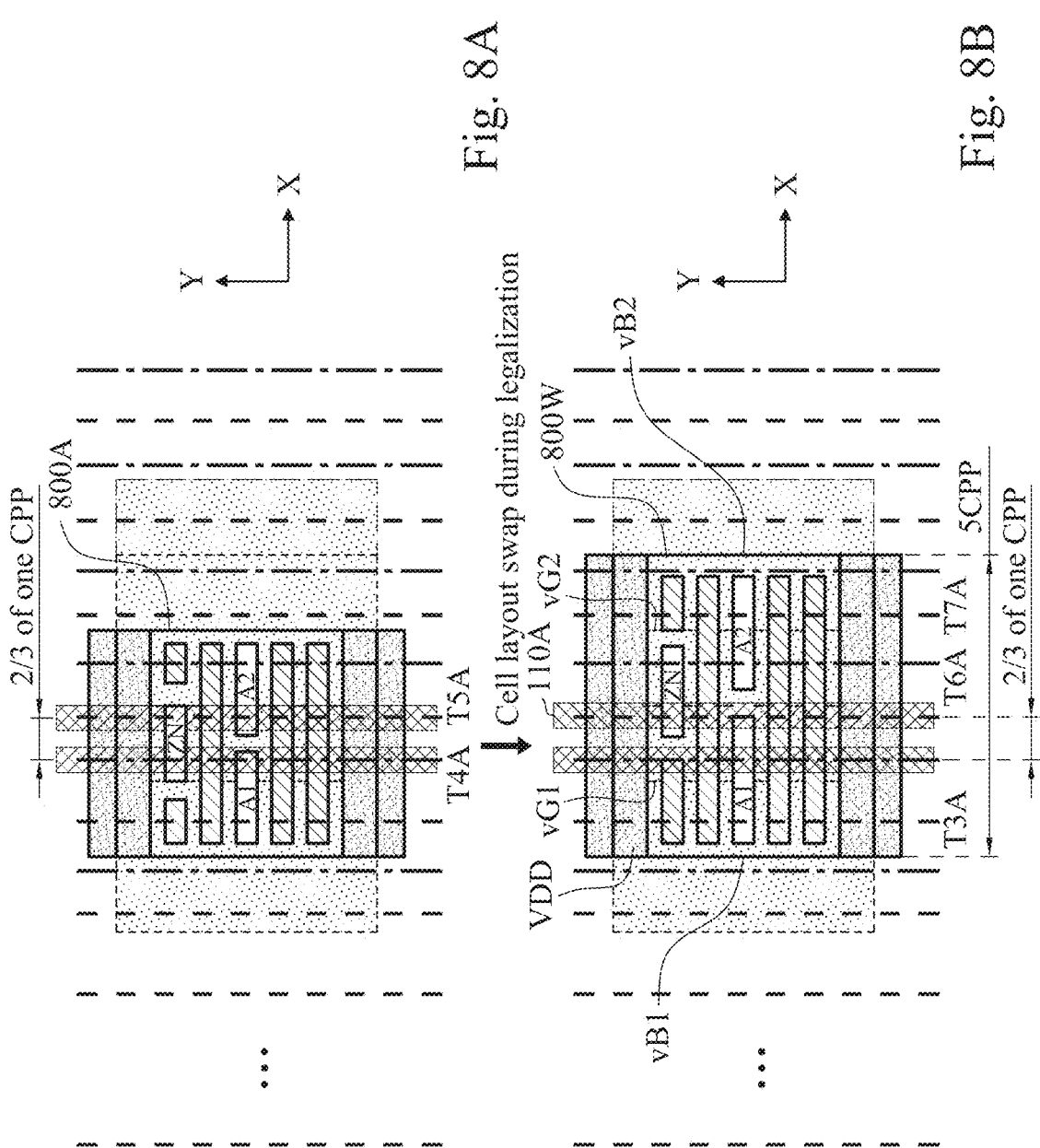
FIGS. 8A-8B are layout diagrams of an integrated circuit having a circuit cell overlapped with pre-route conducting lines, in accordance with some embodiments.

In the example layout designs of FIGS. 1A-1C, FIGS. 2-6, and FIGS. 7A-7C, the distance between two adjacent vertical routing tracks is one CPP. Other layout designs in which the distance between two adjacent vertical routing tracks is different from one CPP are within the contemplated scope of the present disclosure. For example, in the layout designs of FIGS. 8A-8B, the distance between two adjacent vertical routing tracks is ⅔ of a CPP. In FIGS. 8A-8B, the ratio between the pitch distance of the vertical conducting lines and the pitch distance of the gate-conductors (which is aligned with the gate alignment lines) is 2 to 3.

FIGS. 8A-8B are layout diagrams of an integrated having a circuit cell overlapped with pre-route conducting lines, in accordance with some embodiments. The circuit cell 800A in FIG. 8A has a cell layout design similar to the circuit cell 700A in FIG. 7A, but the distance between two adjacent vertical routing tracks in FIG. 8A is different from that in FIG. 7A. Like the circuit cell 700A in FIG. 7A, the circuit cell 800A in FIG. 8A is positioned at a location which causes the circuit cell 800A being overlapped with vertical conducting lines 110A and 112A. The design rule violation in FIG. 8A is remedied as the circuit cell 800A in FIG. 8A is substituted with the wider circuit cell 800W in FIG. 8B. The wider circuit cell 800W is modified from the circuit cell 800A of FIG. 8A, just like the wider circuit cell 700WB or 700WC is modified from the circuit cell 700A of FIG. 7A. The cell width of the wider circuit cell 800W in FIG. 8B is also 5 CPP. In FIG. 8B, the connection pin ZN of the wider circuit cell 800W is accessed from the vertical conducting line in the vertical routing track T6A, while the connection pins A1 and A2 of the wider circuit cell 800W are correspondingly accessed from the vertical conducting lines in the vertical routing tracks T3A and T7A.

Figure 9:
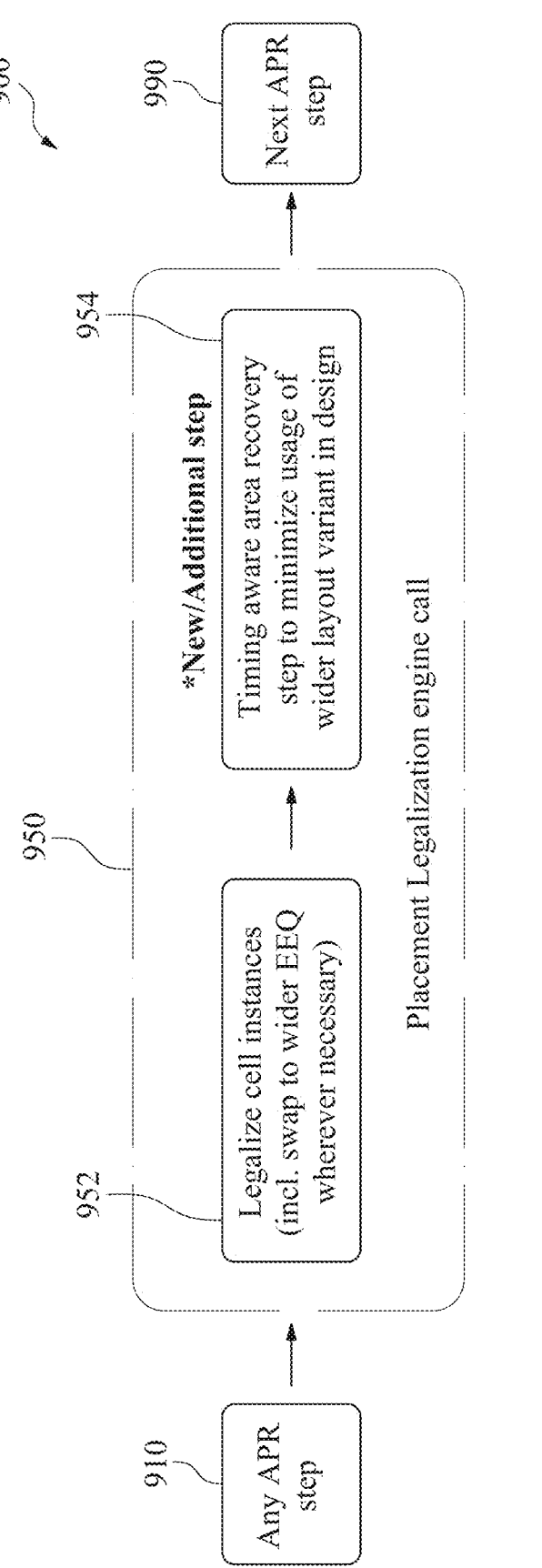
FIG. 9 is a flow chart of a process of legalizing a layout design, in accordance with some embodiments.

FIG. 9 is a flow chart of a process 900 of legalizing a layout design, in accordance with some embodiments. Operation 950 in the process 900 is carried out in an APR program anytime when pin access of circuit cell needs to be legalized. In some embodiments, operation 950 is carried out at least once in an APR program. In some embodiments, operation 950 is carried out at multiple occasions in an APR program. In the example process 900 in FIG. 9, an APR program starts operation 950 after an APR step 910, and proceeds to the next APR step 990 after the APR program finishes operation 950.

In operation 950, when placement legalization engine is called in the APR program, operation 952 and operation 954 are carried out. In operation 952, cell instances are legalized. During the operation of legalizing cell instances, the placement legalization engine checks whether any circuit cell overlaps with one or more pre-route conducting lines which prevent a connection pin extending horizontally from being accessed from any vertical conducting line. The design rule violation related to pin access is remedied when the circuit cell (e.g., 100A in FIG. 1A) that encounters the design rule violation is substituted with a corresponding wider circuit cell (e.g., 100W in FIG. 1B).

During the operation of legalizing cell instances, sometimes several circuit cells are replaced with their corresponding wider-width version of the circuit cells. The substitution of each instance of the circuit cells often results in cascaded displacement of other circuit cells. The displaced circuit cells sometimes include the wider-width circuit cells. In some instances, after the displacement, some of the wider-width circuit cells are candidates for swapping back to the original none-widening version of circuit cells.

After operation 952, operation 954 is carried out, and a timing-aware area recovery step is triggered to swap back some wider-width version of the circuit cells to the original non-widening version of the circuit cells. Some of the wider-width circuit cells are swapped back, because as the original none-widening version of the circuit cells is moved to a new location caused by the cascaded displacement, the design rule violations related to connection pin access in some of the original non-widening version of the circuit cells are no longer in existence. After operation 954, the usage of the circuit cells in the wider-width variant is reduced, whereby layout areas in a floorplan are better utilized.

FIG. 10 is a flow chart of a method 1000 of generating a layout diagram, in accordance with some embodiments. The sequence in which the operations of method 1000 are depicted in FIG. 10 is for illustration only; the operations of method 1000 are capable of being executed in sequences that differ from that depicted in FIG. 10. It is understood that additional operations may be performed before, during, and/or after the method 1000 depicted in FIG. 10, and that some other processes may only be briefly described herein.

In operation 1010 of method 1000, a pre-route conducting line is placed in a first routing track. In the example embodiment as shown in FIGS. 1A-1C, the vertical conducting lines 110A and 110B are correspondingly placed in vertical routing tracks T4A and T1B as pre-route conducting lines. In the example embodiment as shown in FIGS. 7A-7C, the vertical conducting lines 110A and 112A are correspondingly placed in vertical routing tracks T4A and T5A as pre-route conducting lines. After operation 1010, the process proceeds to operation 1020.

In operation 1020 of method 1000, a first circuit cell is placed at a position overlapping the pre-route conducting line. In the example embodiment as shown in FIGS. 1A-1C, the circuit cell 100A is placed at a position overlapping with the vertical conducting line 110A, and the circuit cell 100B is placed at a position overlapping with the vertical conducting line 110B. In the example embodiment as shown in FIGS. 7A-7C, the circuit cell 700A is placed at a position overlapping with the vertical conducting lines 110A and 112A. After operation 1020, the process proceeds to operation 1030.

In operation 1030, an APR program determines whether the pre-route conducting line prevents a connection pin of the first circuit cell from being accessed from another routing track. A connection pin of the first circuit cell is accessible from a second routing track, if an area overlapping the circuit cell is available to place a via-connector to directly connect the connection pin with a vertical conducting line in the second routing track. Conversely, a connection pin of the first circuit cell is inaccessible if no area is available to place a via-connector to directly connect the connection pin with a vertical conducting line aligned with a vertical routing track. In the example embodiment as shown in FIGS. 1A-1C, the connection pin ZN in the circuit cell 110A is inaccessible from a vertical conducting line in any of the vertical routing tracks, whereas each connection pin (e.g., ZN, A1, or A2) in the circuit cell 110B is inaccessible from one of the vertical conducting line aligned with the vertical routing tracks. In operation 1030, if the pre-route conducting line does not prevent a connection pin of the first circuit cell from being accessed from another routing track, the operation proceeds to operation 1070. In operation 1070 of method 1000, the connection pin of the first circuit cell is connected to a vertical conducting line through a via connector. Alternatively, if the pre-route conducting line prevents a connection pin of the first circuit cell from being accessed from another routing track, the operation proceeds to operation 1040.

In operation 1040 of method 1000, the first circuit cell is substituted with a second circuit cell having a wider width. In the example embodiment as shown in FIGS. 1A-1C, the circuit cell 100A in FIG. 1A is substituted with the wider circuit cell 100W in FIGS. 1B-1C. In the example embodiment as shown in FIGS. 7A-7C, the circuit cell 700A in FIG. 7A is substituted with the wider circuit cell 700WB in FIG. 7B or the wider circuit cell 700WC in FIG. 7C. After operation 1040, the process proceeds to operation 1050.

In operation 1050 of method 1000, a vertical conducting line is placed in a second routing track. Then, in operation 1060 of method 1000, the vertical conducting line is connected to a corresponding connection pin of the second circuit cell through a via connector. In the example embodiment as shown in FIG. 1B, a vertical conducting line is placed in the routing track T5A, and the connection pin ZN of the wider circuit cell 100W is directly connected to the vertical conducting line in the routing track T5A through a via connector at the intersection between the connection pin ZN and the vertical conducting line in the routing track T5A. In the example embodiment as shown in FIG. 1C, a vertical conducting line is placed in the routing track T3A, and the connection pin ZN of the wider circuit cell 100W is directly connected to the vertical conducting line in the routing track T3A through a via connector at the intersection between the connection pin ZN and the vertical conducting line in the routing track T3A.

In the example embodiment as shown in FIG. 7B, a vertical conducting line is placed in the routing track T5A, and the connection pin ZN of the wider circuit cell 700WB is directly connected to the vertical conducting line in the routing track T3A through a via connector at the intersection between the connection pin ZN and the vertical conducting line in the routing track T3A. In the example embodiment as shown in FIG. 7C, a vertical conducting line is placed in the routing track T6A, and the connection pin ZN of the wider circuit cell 700WC is directly connected to the vertical conducting line in the routing track T6A through a via connector at the intersection between the connection pin ZN and the vertical conducting line in the routing track T6A.

FIG. 11 is a flow chart of a method 1100 of manufacturing an integrated circuit, in accordance with some embodiments. The sequence in which the operations of method 1100 are depicted in FIG. 11 is for illustration only; the operations of method 1100 are capable of being executed in sequences that differ from that depicted in FIG. 11. It is understood that additional operations may be performed before, during, and/or after the method 1100 depicted in FIG. 11, and that some other processes may only be briefly described herein.

In operation 1110 of method 1100, first-type active-region structures and second-type active-region structures extending in the X-direction are fabricated on a substrate. In the example embodiment as shown in FIG. 1B and FIG. 1D, the active-region structure $80p$ and the active-region structure $80n$ are fabricated on the substrate 20. In some embodiments, when the active-region structures $80p$ and $80n$ are formed with fin structures, the transistors formed with the active-region structures $80p$ and $80n$ are FinFETs. In some embodiments, when the active-region structures $80p$ and $80n$ are formed with nano-sheet structures, the transistors formed with the active-region structures $80p$ and $80n$ are nano-sheet transistors. In some embodiments, when the active-region structures $80p$ and $80n$ are formed with nano-wire structures, the transistors formed with the active-region structures $80p$ and $80n$ are nano-wire transistors. After operation 1110, the process proceeds to operation 1120.

In operation 1120 of method 1100, gate-conductors and terminal-conductors extending in the Y-direction are fabricated. One or more gate-conductors intersect at least one of the first-type active-region structures or the second-type active-region structures. One or more terminal-conductors intersect at least one of the first-type active-region structures or the second-type active-region structures. In the example embodiment as shown in FIG. 1B and FIG. 1D, each of the gate-conductors gT1 and gT2 (either in the circuit cell 100B or in the wider circuit cell 100W) intersects the active-region structure $80p$ at the channel region of a corresponding PMOS transistor, and each of the gate-conductors gT1 and gT2 (either in the circuit cell 100B or in the wider circuit cell 100W) intersects the active-region structure $80n$ at the channel region of a corresponding NMOS transistor. In the example embodiment as shown in FIG. 1B AND FIG. 1D, each of the terminal-conductors $132p$, 135, and $138p$ (either in the circuit cell 100B or in the wider circuit cell 100W) intersects the active-region structure 80*p* at the corresponding source/drain region of at least one PMOS transistor, and each of the terminal-conductors 132*n*, 135, and 138*n* (either in the circuit cell 100B or in the wider circuit cell 100W) intersects the active-region structure 80*n* at the corresponding source/drain region of at least one NMOS transistor. After operation 1120, the process proceeds to operation 1130.

In operation 1130 of method 1100, connection pins extending in the X-direction are formed. In the example embodiment as shown in FIG. 1B and FIG. 1D, the connection pin ZN and the connection pins A1 and A2 (either in the circuit cell 100B or in the wider circuit cell 100W) are formed in a first metal layer (e.g., M0) overlying the interlayer dielectric that covers the gate-conductors (e.g., gT1 and gT2) and the terminal-conductors (e.g., 132*p*, 132*n*, 135, 138*p*, and 138*n*). In other embodiments, the connection pins are formed in a metal layer that is different from the first metal layer (e.g., M0) overlying the interlayer dielectric that covers the gate-conductors and the terminal-conductors. After operation 1130, the process proceeds to operation 1140.

In operation 1140 of method 1100, via-connectors are fabricated in a layer of interlayer dielectrics covering the connection pins. In the example embodiment as shown in FIG. 1B and FIG. 1D, the via-connectors 192A, 195A, 198A, 192B, 195B, and 198B are fabricated in the layer of interlayer dielectric IDL1 that covers the connection pin ZN and the connection pins A1 and A2. After operation 1140, the process proceeds to operation 1150.

In operation 1150 of method 1100, conducting lines extending in the Y-direction are formed in a metal layer overlying the layer of interlayer dielectric that covers the connection pins. In the example embodiment as shown in FIG. 1B and FIG. 1D, vertical conducting lines 172A, 175A, 178A, 172B, 175B, and 178B are formed in a metal layer overlying the layer of interlayer dielectric IDL1. The vertical conducting lines 172A, 175A, 178A are correspondingly connected to the connection pins A1, ZN, and A2 in the wider circuit cell 100W. The vertical conducting lines 172B, 175B, 178B are correspondingly connected to the connection pins A1, ZN, and A2 in the circuit cell 100B.

Figure 12:
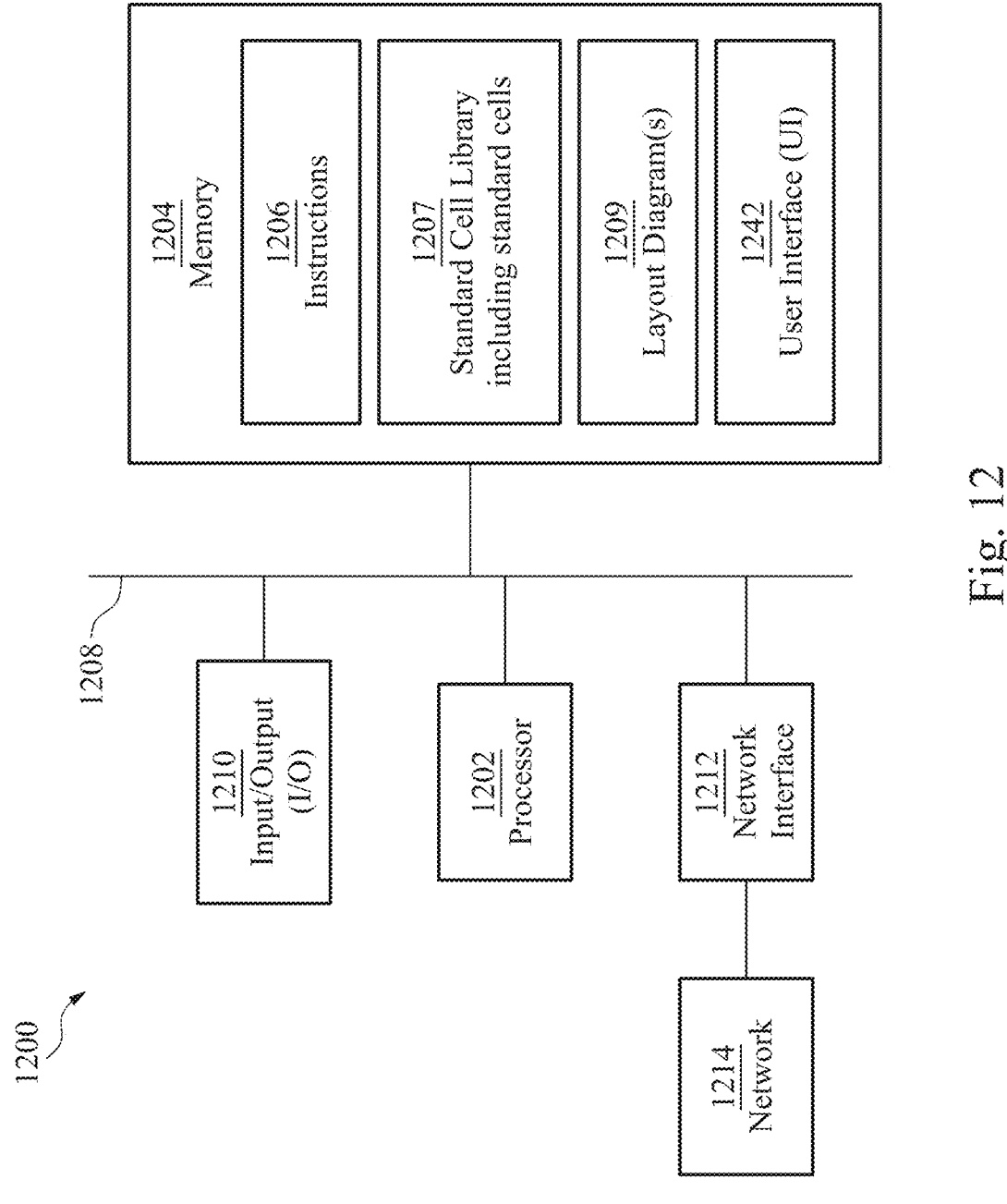
FIG. 12 is a block diagram of an electronic design automation (EDA) system in accordance with some embodiments.

FIG. 12 is a block diagram of an electronic design automation (EDA) system 1200 in accordance with some embodiments.

In some embodiments, EDA system 1200 includes an APR system. Methods described herein of designing layout diagrams represent wire routing arrangements, in accordance with one or more embodiments, are implementable, for example, using EDA system 1200, in accordance with some embodiments.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) an EDA tool which implements a portion or all of the methods described herein in accordance with one or more embodiments (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores library 1207 of standard cells including such standard cells as disclosed herein. In one or more embodiments, storage medium 1204 stores one or more layout diagrams 1209 corresponding to one or more layouts disclosed herein.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1200.

System 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 13:
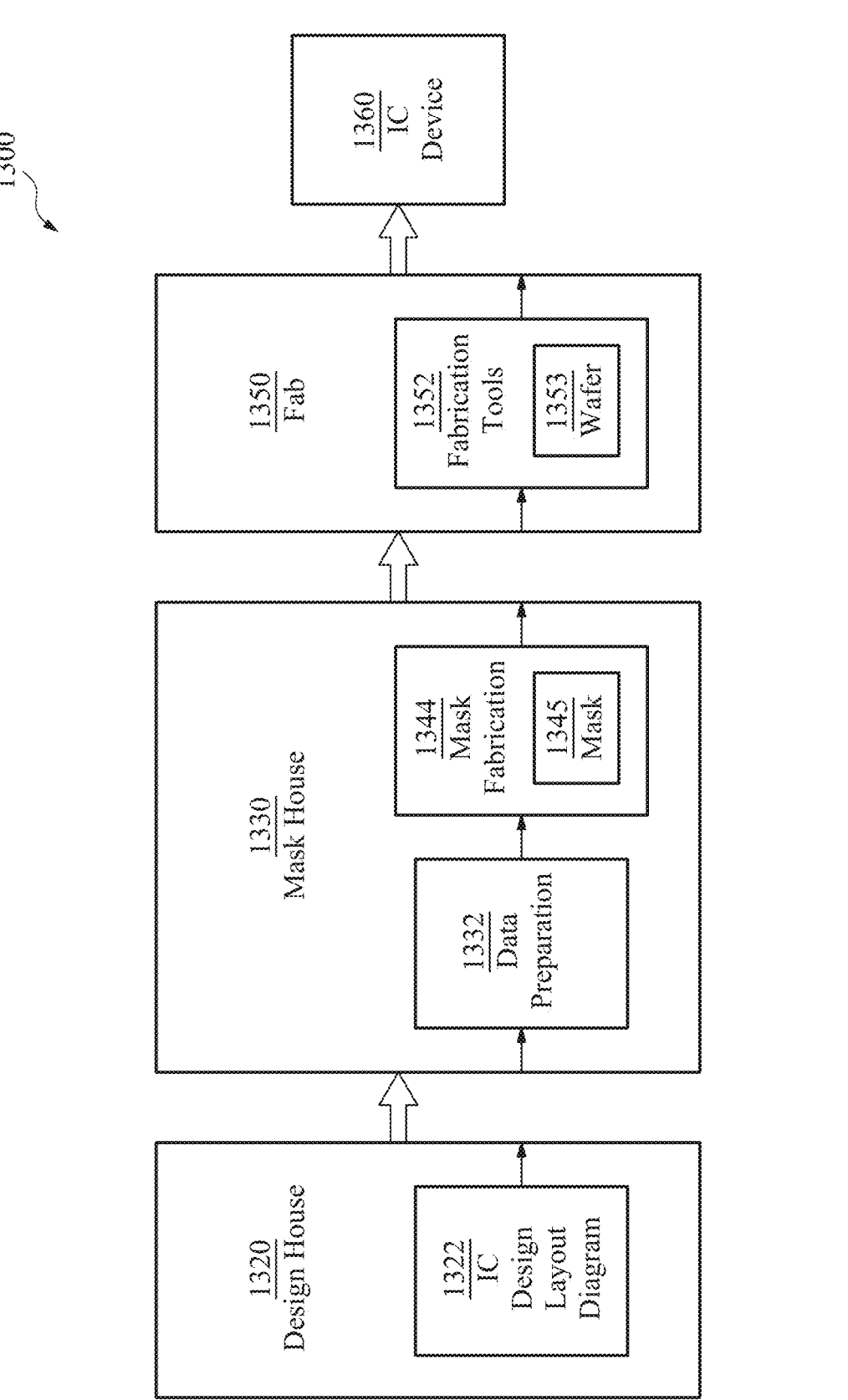
FIG. 13 is a block diagram of an integrated circuit (IC) manufacturing system, and an IC manufacturing flow associated therewith, in accordance with some embodiments.

FIG. 13 is a block diagram of an integrated circuit (IC) manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of mask data preparation 1332 has been simplified for the purposes of clarity. In some embodiments, data preparation 1332 includes additional features such as a logic operation (LOP)

to modify the IC design layout diagram 1322 according to manufacturing rules. Additionally, the processes applied to IC design layout diagram 1322 during data preparation 1332 may be executed in a variety of different orders.

After mask data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 includes fabrication tools 1352 configured to execute various manufacturing operations on semiconductor wafer 1353 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

An aspect of the present disclosure relates to an integrated circuit. The integrated circuit includes a first circuit cell having a first width and a second circuit cell having a second width that is wider than the first width by at least one Contacted Poly Pitch (CPP). An equivalent circuit of the first circuit cell is the same as an equivalent circuit of the second circuit cell.

Another aspect of the present disclosure also relates to an integrated circuit. The integrated circuit includes a first circuit cell having a first width, and a second circuit cell having a second width that is wider than the first width by at least one Contacted Poly Pitch (CPP). The integrated circuit also includes a first connection pin extending in a first direction in the second circuit cell, a first conducting line extending in a second direction and intersecting the first connection pin of the second circuit cell, and a power grid conducting line extending in the second direction and intersecting the second circuit cell. The first direction is perpendicular to the second direction. The power grid conducting line is adjacent to the first conducting line. The first circuit cell and the second circuit cell have same circuit functions.

Another aspect of the present disclosure relates to a method. The method includes fabricating first-type active-region structures and second-type active-region structures. Each of first-type active-region structures and second-type active-region structures extends in a first direction. The method also includes fabricating gate-conductors and terminal-conductors extending in a second direction that is perpendicular to the first direction, and forming connection pins extending in the first direction. At least two connection pins are in a first circuit cell that has a first width and at least two connection pins are in a second circuit cell that has a second width, wherein the first circuit cell and the second circuit cell have same circuit functions. The second width is wider than the first width by at least one Contacted Poly Pitch (CPP). The method further includes fabricating via-connectors in one or more layers of interlayer dielectrics covering the connection pins, and forming conducting lines extending in the second direction in a metal layer overlying the interlayer dielectrics covering the connection pins. Each of a first conducting line and a second conducting line is connected to one of the connection pins in the second circuit cell through one of the via-connectors.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit, comprising:
  a first circuit cell having a first width extending in a first direction;
  a second circuit cell having a second width that is wider than the first width by at least one Contacted Poly Pitch (CPP), wherein an equivalent circuit of the first circuit cell is the same as an equivalent circuit of the second circuit cell;

a first connection pin and a second connection pin in a first metal layer and bounded between two vertical boundaries of the second circuit cell, wherein each of the first connection pin and the second connection pin has a length thereof extending in the first direction and a width thereof measured along a second direction, with the length larger than the width;

a first conducting line and a second conducting line, each of which extending in the second direction in a second metal layer above the first metal layer;

a first via connector directly connecting the first conducting line with the first connection pin;

a second via connector directly connecting the second conducting line with the second connection pin; and a power grid line having a length thereof extending in the second direction in the second metal layer and passing across the second circuit cell, wherein the power grid line extends along the second direction between the first conducting line and the second conducting line.

2. The integrated circuit of claim 1, wherein the second width is larger than the first width by one CPP.

3. The integrated circuit of claim 1, wherein the second width is larger than the first width by two CPPs.

4. The integrated circuit of claim 1, wherein:

the first conducting line and the power grid line is separated by a pitch distance of one CPP; and the second conducting line and the power grid line is separated by a pitch distance of one CPP.

5. The integrated circuit of claim 1, wherein:

the first conducting line and the power grid line is separated by a pitch distance of two thirds of one CPP; and the second conducting line and the power grid line is separated by a pitch distance of two thirds of one CPP.

6. The integrated circuit of claim 1, wherein the equivalent circuit of the first circuit cell is the same as the equivalent circuit of the second circuit cell at a register-transfer level (RTL).

7. The integrated circuit of claim 1, further comprising:

a third connection pin and a fourth connection pin in the first circuit cell, each of which extending in the first direction, wherein a function of the third connection pin in the first equivalent circuit is the same as a function of the first connection pin in the second equivalent circuit, and wherein a function of the fourth connection pin in the first equivalent circuit is the same as a function of the second connection pin in the second equivalent circuit.

8. The integrated circuit of claim 7, further comprising:

a third conducting line and a fourth conducting line, each of which extending in the second direction;

a third via connector directly connecting the third conducting line with the third connection pin; and a fourth via connector directly connecting the fourth conducting line with the fourth connection pin.

9. The integrated circuit of claim 8, wherein the third conducting line and the fourth conducting line are adjacent to each other.

10. An integrated circuit, comprising:

a first circuit cell having a first width;

a second circuit cell having a second width that is wider than the first width by at least one Contacted Poly Pitch (CPP);

a first connection pin extending in a first direction in a first metal layer and bounded between two vertical boundaries of the second circuit cell, wherein the first connection pin has a length thereof extending in the first direction and a width thereof measured along a second direction, with the length larger than the width;

a first conducting line extending in the second direction in a second metal layer above the first metal layer and intersecting the first connection pin of the second circuit cell, the first direction being perpendicular to the first direction;

a power grid conducting line having a length thereof extending in the second direction in the second metal layer between the two vertical boundaries of the second circuit cell and passing across the second circuit cell, wherein the power grid conducting line is adjacent to and in parallel with the first conducting line; and wherein the first circuit cell and the second circuit cell have same circuit functions.

11. The integrated circuit of claim 10, wherein the first circuit cell and the second circuit cell have a same equivalent circuit at a register-transfer level (RTL).

12. The integrated circuit of claim 10, wherein the first circuit cell and the second circuit cell have a same equivalent circuit as specified by a hardware description language.

13. The integrated circuit of claim 10, wherein the first circuit cell and the second circuit cell are different layout designs of a same logic gate.

14. The integrated circuit of claim 10, wherein the first circuit cell and the second circuit cell are different layout designs of different layout designs of a same analog circuit as described by a pre-layout netlist file.

15. The integrated circuit of claim 10, wherein the second width is larger than the first width by either one CPP or two CPPs.

16. The integrated circuit of claim 10, further comprising:

a second connection pin extending in the first direction in the second circuit cell; and a second conducting line extending in the second direction and intersecting the second connection pin of the second circuit cell, wherein the power grid conducting line is also adjacent to the second conducting line.

17. The integrated circuit of claim 10, wherein the second width is larger than the first width by one CPP.

18. A method comprising:

fabricating first-type active-region structures and second-type active-region structures, wherein each of first-type active-region structures and second-type active-region structures extends in a first direction;

fabricating gate-conductors and terminal-conductors extending in a second direction that is perpendicular to the first direction;

forming connection pins extending in the first direction in a first metal layer, wherein each of the connection pins has a length thereof extending in the first direction and a width thereof measured along the second direction, with the length larger than the width, wherein at least two connection pins are in a first circuit cell that has a first width and at least two connection pins are in a second circuit cell that has a second width, wherein the first circuit cell and the second circuit cell have same circuit functions, and wherein the second width is wider than the first width by at least one Contacted Poly Pitch (CPP);

fabricating via-connectors in one or more layers of interlayer dielectrics covering the connection pins; and forming conducting lines extending in the second direction in a second metal layer overlying the interlayer dielectrics covering the connection pins, and wherein each of a first conducting line and a second conducting line is connected to, through one of the via-connectors, one of the connection pins which is bounded between two vertical boundaries of the second circuit cell; and forming a power grid conducting line having a length thereof extending in the second direction in the second metal layer and passing across the second circuit cell, wherein the power conducting grid line extends along the second direction between the first conducting line and the second conducting line.

19. The method comprising of claim 18, wherein forming the connection pins comprises:

forming connection pins in a first metal layer overlying a first layer of interlayer dielectric covering the gate-conductors and terminal-conductors.

20. The method comprising of claim 18, wherein the forming conducting lines comprises:

forming a third conducting line and a fourth conducting line each of which connected to one of the connection pins in the first circuit cell through one of the via-connectors, wherein the third conducting line and the fourth conducting line are adjacent to each other.

\* \* \* \* \*